(12) United States Patent  
Yamazaki

(10) Patent No.: US 8,093,709 B2
(45) Date of Patent: Jan. 10, 2012

(54) SEMICONDUCTOR DEVICE AND MANUFACTURING METHOD THEREOF

(75) Inventor: Takao Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/024,910

(22) Filed: Feb. 10, 2011

(65) Prior Publication Data

US 2011/0140264 A1   Jun. 16, 2011

Related U.S. Application Data

(63) Continuation of application No. 12/515,437, filed on May 19, 2009, now Pat. No. 7,928,556.

(30) Foreign Application Priority Data

Sep. 19, 2007   (JP) .................................. 2007-242396

(51) Int. Cl.
  *H01L 23/498*   (2006.01)
(52) U.S. Cl. .. 257/693; 257/737; 257/778; 257/E21.509
(58) Field of Classification Search .................. 257/693, 257/737, 738, 778, E23.065, E21.06
  See application file for complete search history.

(56) References Cited

U.S. PATENT DOCUMENTS

| 5,805,422 | A | 9/1998 | Otake et al. |
| 2001/0054762 | A1 | 12/2001 | Yamazaki et al. |
| 2005/0161793 | A1 | 7/2005 | Ohno et al. |
| 2006/0049495 | A1 | 3/2006 | Hazeyama et al. |
| 2006/0055053 | A1 | 3/2006 | Yamazaki et al. |

FOREIGN PATENT DOCUMENTS

JP   8-335663 A   12/1996

OTHER PUBLICATIONS

Supplementary European Search Report for EP 08 83 1960 completed Feb. 8, 2011.

*Primary Examiner* — Roy Potter

(57) ABSTRACT

There is provided a low-cost semiconductor device that commercial and quality-assured (inspected) chip size packages can be stacked and has a small co-planarity value and a high mounting reliability. A semiconductor device in which a flexible circuit substrate is adhered to at least a part of a lateral side of a semiconductor package, and the flexible circuit substrate, which is on a side facing solder balls of the semiconductor package, is folded at a region inside of an edge of the semiconductor package (FIG. 1).

12 Claims, 36 Drawing Sheets (EXEMPLARY EMBODIMENT 1)

(EXEMPLARY EMBODIMENT 1)

FIG. 8 (MODIFED EXEMPLARY EMBODIMENT 1)

FIG. 9 (EXEMPLARY EMBODIMENT 4)

FIG. 12A (EXEMPLARY EMBODIMENT 5)
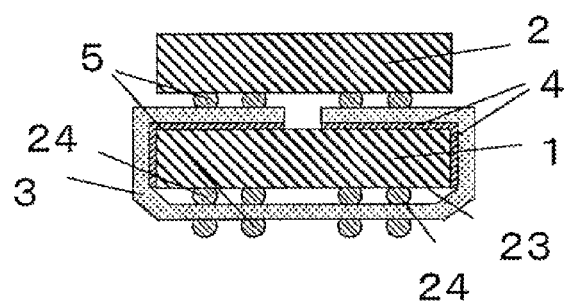
FIG. 12B (EXEMPLARY EMBODIMENT 5)
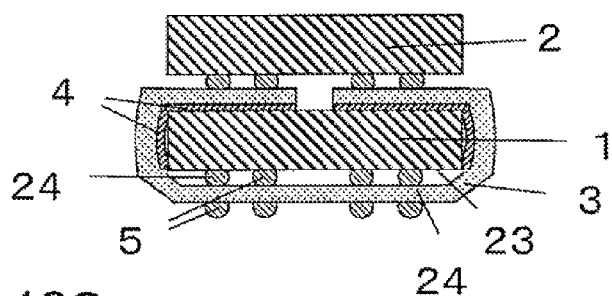
FIG. 12C (EXEMPLARY EMBODIMENT 5)
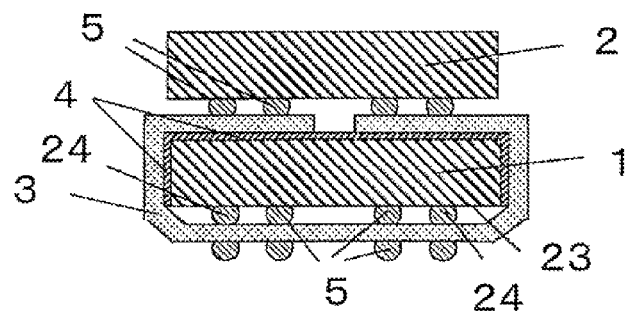

(EXEMPLARY EMBODIMENT 6)

(EXEMPLARY EMBODIMENT 7)

(EXEMPLARY EMBODIMENT 8)

FIG. 19 (EXEMPLARY EMBODIMENT 9)

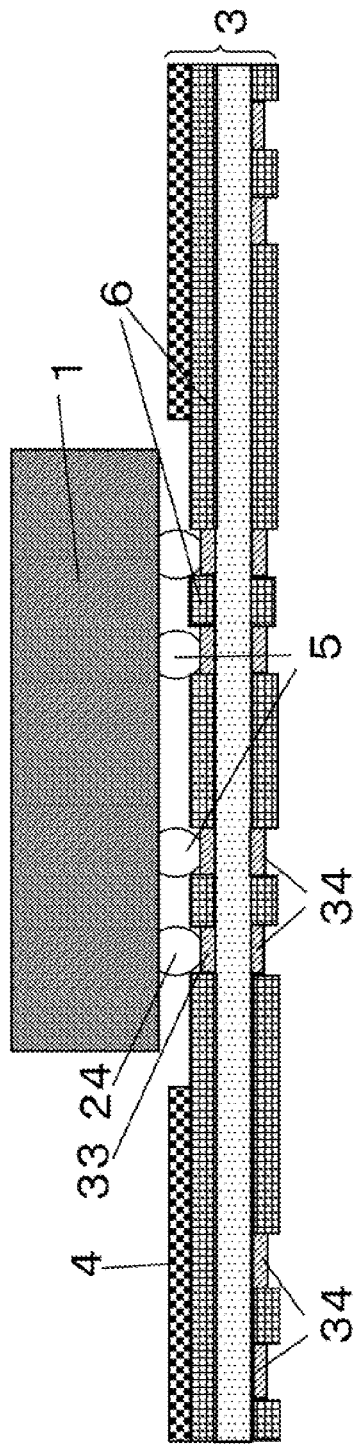
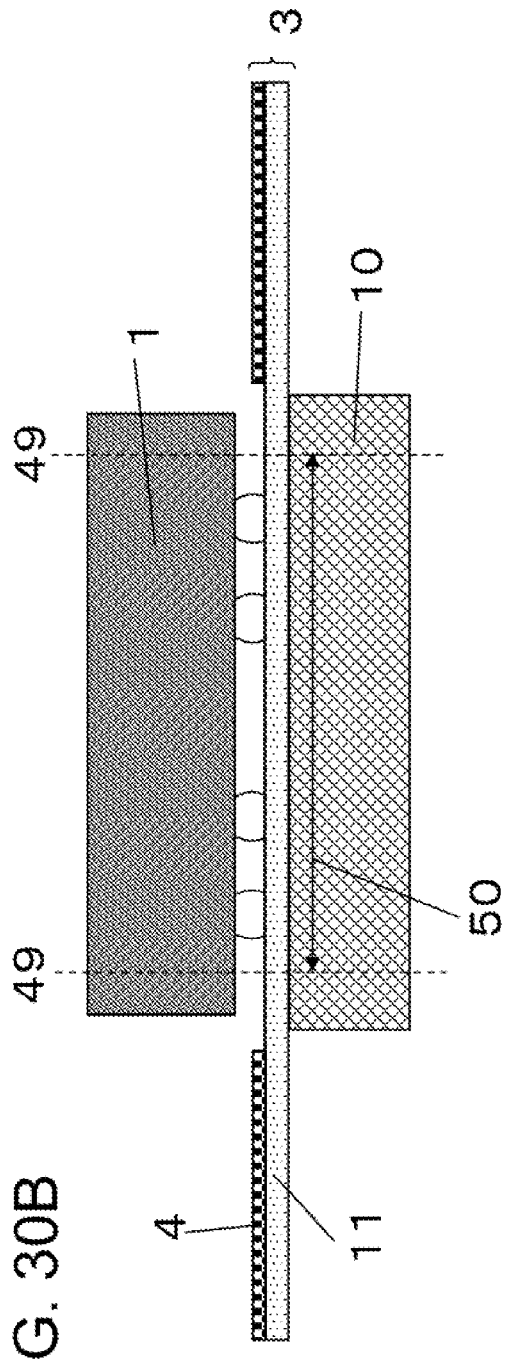

SEMICONDUCTOR DEVICE AND MANUFACTURING METHOD THEREOF

REFERENCE TO RELATED APPLICATION

This is a continuation application of U.S. patent application Ser. No. 12/515,437 filed May 19, 2009 now U.S. Pat. No. 7,928,556 and claims the benefit of its priority.

TECHNICAL FIELD

The invention relates to a high-density mounted semiconductor device in which multiple semiconductor packages and passive components are mounted three dimensionally.

BACKGROUND ART

A three dimensionally mounted semiconductor device 200 shown in FIG. 28 is a conventional three dimensionally mounted semiconductor device disclosed in U.S. Pat. No. 6,576,992 (Patent Document 1). The device is a three dimensionally mounted semiconductor device structured such that a first chip size package (CSP) 201 of ball grid array (BGA) type is mounted on a first flexible circuit substrate 203 and a second flexible circuit substrate 204, and the two flexible circuit substrates are folded so that the two flexible circuit substrates are adhered to the backside of the first CSP 201 (an opposite side of the first CSP 201 to a side on which solder balls 205 are mounted) by an adhesive 206, and a second CSP 202 is mounted on the first and second fixed flexible circuit substrates 203 and 204. The device is a solution to miniaturize an electric device using the CSPs since a mounting area becomes half compared with an area when two CSPs are mounted two dimensionally.

The device has another merit that the CSPs are checked and quality assured at the time of purchasing, and therefore it is easy to obtain the CSP devices even for non-manufacturers (generally it is difficult to obtain bear chips for manufacturers except semiconductor makers) and also an inspection cost for the manufacturers can be much reduced. As a result, even equipment or component manufacturers except semiconductor manufacturers can fabricate various kinds of small-sized and low-cost three dimensionally mounted semiconductor devices by combining the CSPs.

In addition, Patent Document 2 (JP Patent Kokai Publication No. JP-P2002-76263A) discloses a technique to control a position of folding by providing a stiffened pattern on a flexible substrate. Patent Document 3 (JP Patent Kokai Publication No. JP-H10-112478A) discloses a mounting method to restrict a warp of a BGA package during heating process using an adhesive or spacer.
[Patent Document 1] U.S. Pat. No. 6,576,992
[Patent Document 2] JP Patent Kokai Publication No. JP-P2002-76263A
[Patent Document 3] JP Patent Kokai Publication No. JP-H10-112478A

DISCLOSURE OF THE INVENTION

Problems to be Solved by the Invention

The entire disclosures of Patent Documents 1 to 3 are incorporated herein by reference thereto. The following analyses are given by the present invention.

According to the conventional art, since lateral sides 207 of the CSP are not adhered to the first flexible circuit substrates 203 and the second flexible circuit substrate 204 as shown in FIG. 28, non-adhered regions 208 where the first and second flexible circuit substrates are not fixed are wide (the length may be estimated 2 to 3 mm from an external size of a standard CSP of BGA type). When the region 208 where the first and second flexible circuit substrates are not fixed is wide, the flexible circuit substrates of the region 208 unfixed to the CSP move easily when the solder balls 205 are re-molten during a reflow step to connect upper and lower CSPs by the solder balls 205. Then shapes (especially heights) of the solder balls after setting vary widely and it may cause a poor co-planarity of the CSP (co-planarity value of the solder balls 205 becomes large).

In more detail, it is known that when a co-planarity of solder balls becomes about 0.1 mm or larger, a disconnection of a solder connection will occur. Thus, a co-planarity of solder balls of a CSP is to be about 0.1 mm or less. It is difficult to realize a co-planarity value equal to or less than 0.1 mm by the structure with a wide region 208 where the first and second flexible circuit substrates 203 and 204 are not fixed as the conventional art and thus a disconnection rate of a three dimensional mounting semiconductor device may increase.

When using the method disclosed in Patent Document 2, a wide and rigid stiffened pattern is necessary to bend determined position, and therefore it causes a decreasing of degree of freedom of the wiring pattern design and an increasing of manufacturing cost. The same problems will occur when using the warp restriction method disclosed in Patent Document 3 for adjusting a bending position.

It is an object of the present invention to provide a low-cost semiconductor device that commercial and quality-assured (inspected) chip size packages can be stacked and has a small co-planarity value and a high mounting reliability. Another object of the present invention is to provide a downsized, high performance and low-cost electronic device using the semiconductor device according to the present invention.

Means to Solve the Problems

According to a semiconductor device of the present invention, a flexible circuit substrate is adhered to at least a part of a lateral side of a CSP.

However, experiments of the inventor proved that it is difficult to improve a co-planarity of the conventional art by only adhering the flexible circuit substrate to at least a part of a lateral side of a CSP. That is, even when the flexible circuit substrate is adhered to the lateral side of the CSP, the co-planarity of the CSP becomes poor (the co-planarity value becomes large) if the flexible circuit substrate 209 is bent at an edge 213 of solder balls that are located on the outermost area, because the solder balls on the outermost area decrease their heights when the solder balls are molten during a reflow step due to a tension of the flexible circuit substrate 211 (the tension causes a collapse of the solder ball) in a direction 212 along the height of the solder balls as shown in an oval in FIG. 29.

According to a first aspect of the present invention, there is provided a semiconductor device in which a flexible circuit substrate is adhered to at least a part of a lateral side of a semiconductor package, and the flexible circuit substrate, which is on a side facing solder balls of the semiconductor package, is folded at a region 25 that is inside of an edge of the semiconductor package. Preferably, the flexible circuit substrate is folded also at a region 26 that is outside of outermost solder balls 24 on the semiconductor package.

Preferably, a portion of the flexible circuit substrate from the folded position that is outside of the outermost solder balls to the lateral side of the semiconductor package does not contact with the outermost solder balls.

Preferably, the flexible circuit substrate is provided with an adhesive layer on at least a part region of its surface area on a side the semiconductor package is connected, and the surface area is in contact with both lateral sides of the semiconductor package and an opposite side of the semiconductor package to a side where external terminals are provided.

An adhesive layer may be provided on at least a part region of the lateral side of the semiconductor package or the opposite side to the side where external terminals are provided, which is in contact with the flexible circuit substrate.

Preferably the adhesive material is made of a thermoplastic resin and the thickness of the thermoplastic resin is not less than 20 micrometers.

Preferably, the thermoplastic resin is a thermoplastic polyimide resin and a glass transition temperature of the resin ranges 70 to 140 degree C. However, the limitation figures are not so strict. When the glass transition temperature of the resin is within the range, the flexible circuit substrate and the semiconductor package can be adhered at the temperature of about 150 to 220 degree C., and the temperature is less than a melting point of a Pb-free solder of SnAg-system that is generally used as solder balls for semiconductor packages. (Generally, an adhesion becomes possible at a temperature higher than the glass transition temperature by about 80 degree C. The glass transition temperature is only an inflection point changing its modulus of elasticity and an adhesion is not enough at the glass transition temperature because the material does not become sticky enough at the temperature.) Therefore, the solder balls on the semiconductor package do not melt by the heating during the adhesion process of the flexible circuit substrate and the semiconductor package using the thermoplastic resin. On the other hand, when using a thermoplastic resin having a glass transition temperature more than about 140 degree C., the semiconductor package and the flexible circuit substrate should be heated up to more than about 220 degree C. to adhere them each other and the solder balls of SnAg-system alloy would melt. Then the solder ball would make a short with a next solder ball due to a pressure for the adhesion. The reason of the lower temperature limit 70 degree C. is that when the glass transition temperature is higher than a maximum operation temperature (about 70 degree C. as a guaranteed operation temperature), there will be no risk of detachment of the flexible circuit substrate.

The adhesive material may be made of a thermosetting resin before setting. However, when utilizing the thermosetting resin, it should be noted that the flexible circuit substrate before pre-adhesion with the thermosetting resin before setting and before adhesion to a CSP after pre-adhesion with the thermosetting resin be kept in a cool atmosphere so as to prevent thermosetting in a room temperature. The thickness of the thermosetting resin is preferably 20 micrometers or more.

An underfill resin may not be filled between the flexible circuit substrate and the semiconductor package.

When manufacturing a three dimensionally stacked package in which a plurality of semiconductor packages and/or passive components (capacitor, resistance and inductor) are stacked, at least one CSP of the present invention is preferably contained. Also such a three dimensionally stacked package may preferably be mounted in a circuit substrate, module or electronic device.

According to one aspect of the fabrication method of the present invention, the method comprises a step that a flexible circuit substrate, which is connected to a semiconductor package with solder balls, is folded at a region that is inside of an edge of the semiconductor package under an application of heat, and the flexible circuit substrate is adhered to a lateral side of the semiconductor package and an opposite side of the semiconductor package to a side where external terminals are provided. Preferably the region folding the flexible circuit substrate is outside of outermost solder balls of the semiconductor package.

The method may comprise steps of inserting a supporter between the semiconductor package and the flexible circuit substrate in the region that is inside of an edge of the semiconductor package and also at the region that is outside of the outermost solder balls, folding the flexible circuit substrate at an edge of the supporter under an application of heat and adhering the flexible circuit substrate to the lateral side of the semiconductor package and the opposite side of the semiconductor package to the side where external terminals are provided, and drawing out the supporter after folding the flexible circuit substrate. The folding along the supporter makes it possible to determine the folding position of the flexible circuit substrate accurately.

Another method may comprise steps of connecting the semiconductor package and the flexible circuit substrate by the solder balls on the semiconductor package, fixing the device of connected semiconductor package and flexible circuit substrate on a heating stage, inserting a supporter between the semiconductor package and the flexible circuit substrate, folding the flexible circuit substrate at an edge of the supporter under an application of heat and adhering the flexible circuit substrate to the lateral side of the semiconductor package and the opposite side of the semiconductor package to the side where external terminals are provided, and drawing out the supporter after folding the flexible circuit substrate.

Preferably, the method comprises a step of cooling the heating stage not higher than a glass transition temperature of an insulation layer at the uppermost surface of the flexible circuit substrate before drawing out the supporter.

Preferably, the supporter has a shape of a rectangle from which one side is removed.

Preferably, a thickness of the supporter is smaller than a gap (distance) between the semiconductor package and the flexible circuit substrate, and an external size of the supporter is smaller than an external size of the semiconductor package.

Grooves are preferably formed on a surface of the supporter, at least an area where it makes contact with the flexible circuit substrate.

A non-adhesive layer is preferably formed on a surface of the supporter, at least in an area where it makes contact with the flexible circuit substrate.

The non-adhesive is preferably chosen from a group consisting of a poly tetrafluoroethylene resin (PTFE), poly tetrafluoroethylene-perfluoroalkoxyethylen copolymer resin (PFA) and poly tetrafluoroethylene-hexafluoropropylene copolymer resin (FEP).

The method may comprise a step of putting a crease in the flexible circuit substrate at a region inside of an edge of the semiconductor package and also at a region outside of the outermost solder balls on the semiconductor package.

Preferably, the device of connected semiconductor package and flexible circuit substrate is fixed on a heating stage and the flexible circuit substrate is folded. Then the flexible circuit substrate can be heated in a fixed state.

The heating stage may preferably be provided with an adsorption means and the flexible circuit substrate is folded in the state that the device is fixed by the adsorption means. The heating stage area may be separated and each separated portion may be independently controlled. Thus desired position of the flexible circuit substrate can be folded by adsorbing the substrate on the heating stage by the adsorption means and releasing a portion of the flexible circuit substrate outside of the position to be folded. The adsorption means may preferably be a vacuum adsorption means.

Meritorious Effects of the Invention

The semiconductor device according to the present invention is a low-cost semiconductor device that can be manufactured by stacking quality-assured (inspected) chip size packages available in market and also has a high mounting reliability due to its small co-planarity. A downsized, high performance and low-cost electronic apparatus can be realized using semiconductor devices of the present invention.

BRIEF DESCRIPTION OF THE DRAWINGS

FIGS. 12A to 12C show schematic sectional views of a semiconductor device according to an exemplary embodiment 5 of the present invention.

FIGS. 30A and 30B are schematic sectional views showing a manufacturing method of a semiconductor device according to an exemplary embodiment 2 of the present invention.

Figure 1A:
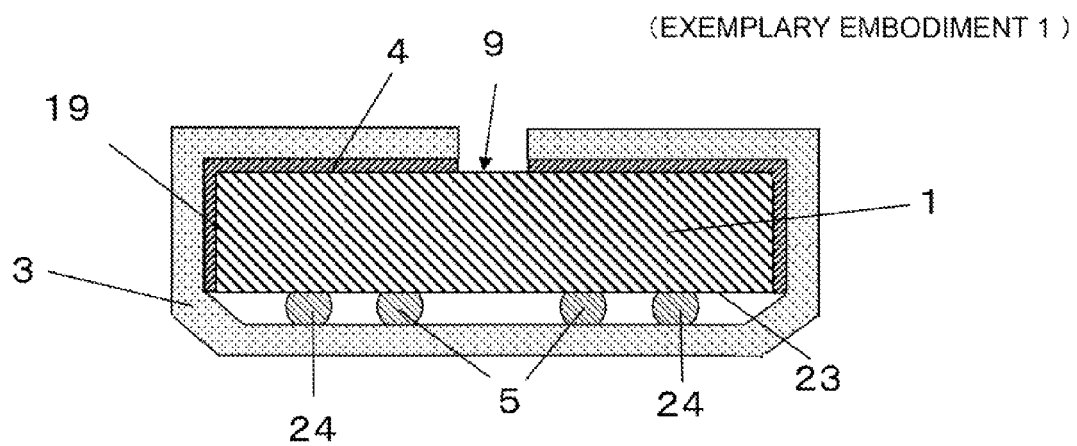
FIG. 1A shows a schematic sectional view of a semiconductor device according to an exemplary embodiment 1 of the present invention.

EXPLANATIONS OF SYMBOLS 1 first CSP of BGA type
2 second CSP of BGA type
3 flexible circuit substrate
4 adhesive layer
5 solder ball
6 solder resist
7 external terminal
8 interlayer insulation layer
9 opposite side to a side on which solder balls are mounted
10 heating stage
11 portion of flexible circuit substrate except adhesive layer
12 supporter
13 gap between CSP and flexible circuit substrate
14 external size of supporter
15 external size of CSP
16 inside size of supporter
17 distance from end to end of outermost solder balls of CSP
18 edge of supporter
19 lateral side of CSP
20 part of lateral side of CSP
21 region of lateral side of CSP near to surface where solder balls are mounted
22 pressing tool
23 side where solder balls are mounted
24 outermost solder balls of CSP
25 inside region from outer edge of CSP
26 region inside of outer edge of CSP and outside of outermost solder balls of CSP
27 flux
28 semiconductor device according to exemplary embodiment 1 of the present invention
29 semiconductor device except BGA type
30 lead terminal
31 third CSP of BGA type
32 passive component (capacitor, resistor or inductor)
33 first external terminal
34 second external terminal
35 forth CSP of BGA type
36 semiconductor package
37 distance from outer edge of first CSP to outer edge of second CSP
38 distance from edge of outermost solder ball of first CSP to edge of outermost solder ball of second CSP
39 gap between first CSP and flexible circuit substrate
40 gap between second CSP and flexible circuit substrate
41 CSP used for exemplary embodiment 1
42 surface area of supporter that contacts with flexible circuit substrate
43 groove
44 non-adhesive layer
45 surface that contacts with flexible circuit substrate
46 circuit substrate
47 semiconductor device according to exemplary embodiment 1 of the present invention
48 hole of vacuum adsorption
49 position to be folded on flexible circuit substrate
50 region of fixed flexible circuit substrate on heating stage
200 conventional semiconductor device
201 first CSP of BGA type
202 second CSP of BGA type
203 first flexible circuit substrate
204 second flexible circuit substrate
205 solder ball
206 adhesive
207 lateral side of first CSP of BGA type
208 region where flexible circuit substrate is not fixed
209 flexible circuit substrate
210 outermost solder ball
211 portion of flexible circuit substrate loaded with tension along height direction of solder ball
212 height direction of solder ball
213 edge of solder ball

PREFERRED MODES FOR CARRYING OUT THE INVENTION

Some exemplary embodiments of the present invention are explained below with reference to the drawings in detail.

Exemplary Embodiment 1

FIG. 1A shows a schematic sectional view of a semiconductor device according to an exemplary embodiment 1 of the present invention. The semiconductor device shown in FIG. 1A includes a first CSP 1 of BGA type (referred as "first CSP" hereinafter), flexible circuit substrate 3 and adhesive layer 4 to adhere the flexible circuit substrate 3 and the first CSP 1. A thermosetting adhesive of epoxy resin-system or a thermoplastic resin of polyimide-system will be used for the adhesive layer 4. A thermoplastic polyimide resin having a glass transition temperature about 70 to 140 degree C. is used for the adhesive layer 4 in the exemplary embodiment 1 because it is easy to handle since no temperature control is necessary and it needs no thermal curing (heat treatment) step after adhesion.

Figure 1B:
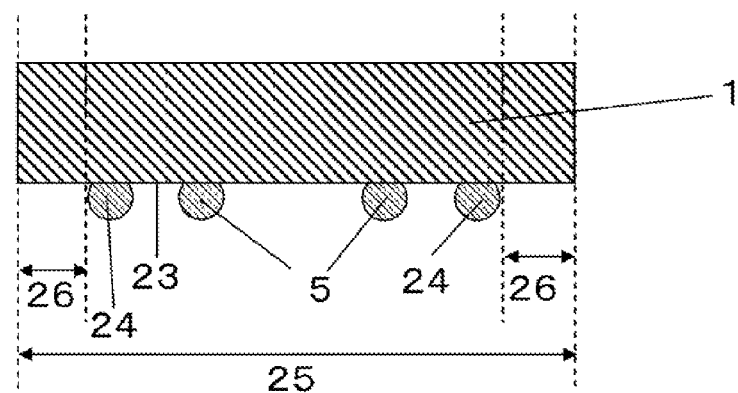
FIG. 1B shows a relation between a region 25 and a region 26 of a CSP shown in FIG. 1A.

FIG. 1B shows a relation between a region 25 that locates inside of the outer edge of the semiconductor package 1 and a region 26 that locates outside of the outermost solder balls 24 on the semiconductor package 1.

Figure 2A:
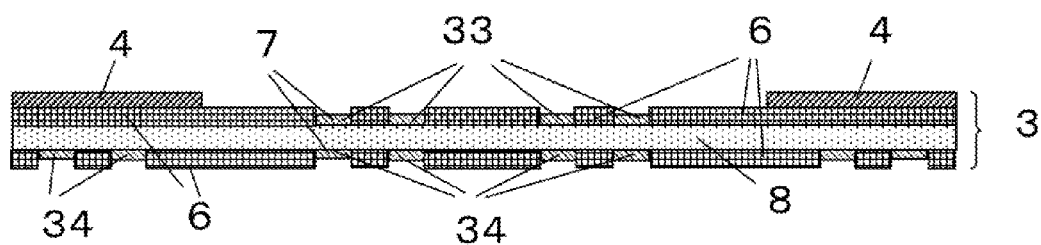
FIG. 2A shows a schematic sectional view of a flexible circuit substrate of an exemplary embodiment 1, in which an adhesive layer is provided on a solder resist layer.
Figure 2B:
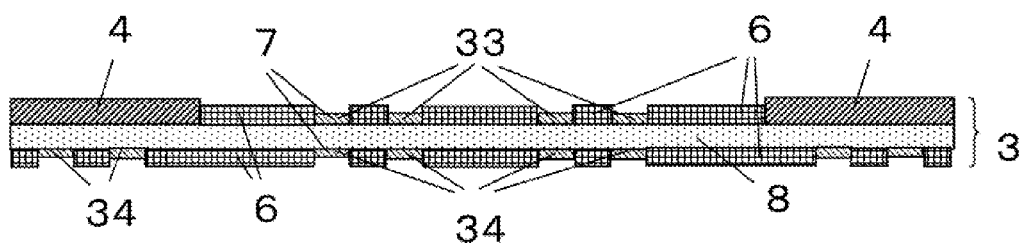
FIG. 2B shows a schematic sectional view of a flexible circuit substrate of an exemplary embodiment 1, in which an adhesive layer is provided on an interlayer insulation layer.

FIGS. 2A and 2B show schematic sectional views of a structure of flexible circuit substrates 3 used for fabricating a semiconductor device according to an exemplary embodiment 1 of the present invention. Although the structure is not shown in FIG. 1A, one or more wiring layers are provided in the flexible circuit substrate 3. In the case two wiring layers are provided as shown in FIG. 2, the flexible circuit substrate 3 is structured by a solder resist 6, external terminal 7 formed by patterned copper wiring, interlayer insulation layer 8 made of polyimide as a main component and adhesive layer 4. External terminals 7 are formed on both sides of the flexible circuit substrate 3. First external terminals 33 are formed on the side on which the first CSP is connected and second external terminals 34 are formed on the side opposite to the side the first CSP is connected. Vias are formed in the interlayer insulation layer 8 (not shown in the figure), and conductive patterns that locate on the same plane of the first external terminals and conductive patterns that locate on the same plane of the second external terminals are electrically connected by the vias.

The difference of FIG. 2A and FIG. 2B is that the adhesive layer 4 is adhered on a surface of the solder resist 6 in FIG. 2A, on the other hand, the adhesive layer 4 is adhered on a surface of the interlayer insulation layer 8 in FIG. 2B. The selection which structure shown in FIG. 2A or FIG. 2B should be used is determined by comparing adhesion strength between the adhesive layer 4 and the solder resist 6 and adhesion strength between the adhesive layer 4 and the interlayer insulation layer 8. When both of the adhesion strengths are not so different, the structure shown in FIG. 2B is preferable in view of a thickness of the semiconductor device because total thickness of the flexible circuit substrate can be reduced by the structure shown in FIG. 2B.

As shown in FIG. 2, the flexible circuit substrate of the semiconductor device itself has an adhesion capacity according to an exemplary embodiment 1 of the present invention.

A fabrication method of the semiconductor device according to an exemplary embodiment 1 of the present invention will be explained with reference to FIG. 3. The detailed section of the flexible circuit substrate 3 will be abbreviated for simplification in and after FIG. 3B to explain the fabrication method.

Figure 3A:
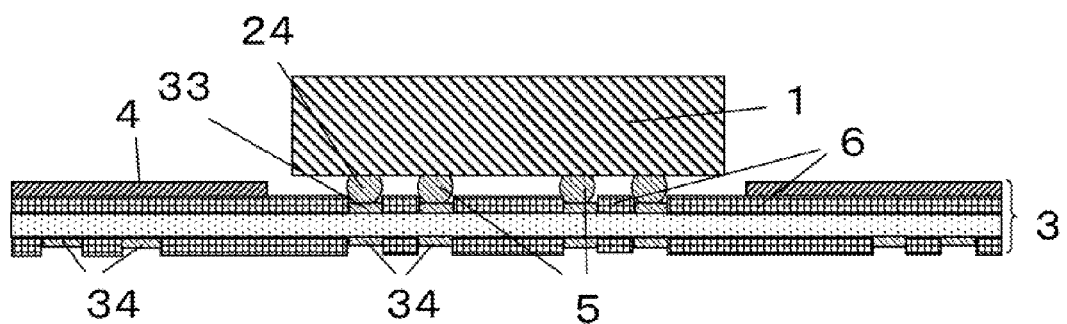
FIGS. 3A and 3B are schematic sectional views showing a manufacturing method of a semiconductor device according to an exemplary embodiment 1 of the present invention.
Figure 3B:
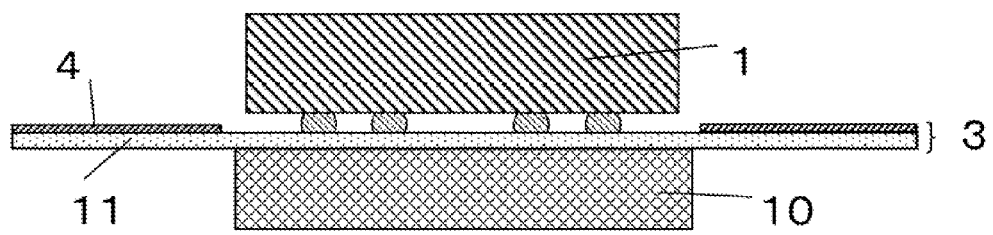
Figure 4A:
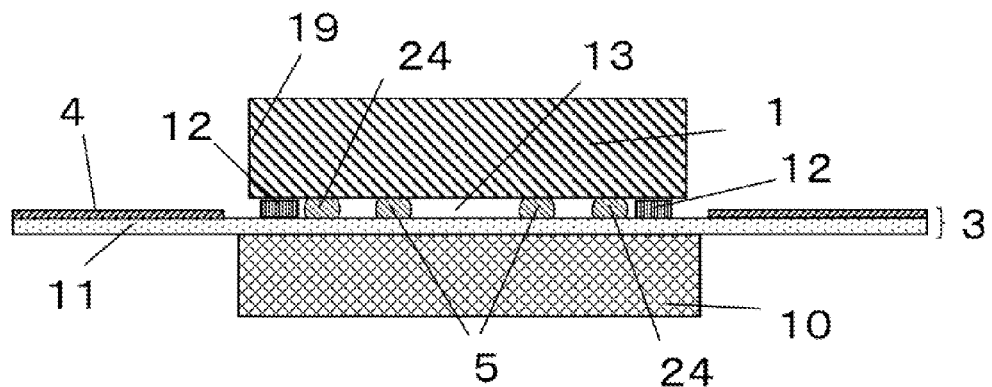
FIGS. 4A and 4B are schematic sectional view and plan view showing a manufacturing method of a semiconductor device according to an exemplary embodiment 1 of the present invention.

At first, as shown in FIG. 3A, the solder balls 5 of the first CSP 1 and the first external terminals 33 on the flexible circuit substrate 3 are connected using a reflow method. Next, as shown in FIG. 3B, the sample device that both of the first CSP 1 and the flexible circuit substrate are combined is fixed on a heating stage 10 using a vacuum system (not shown). Then, as shown in FIG. 4A, a supporter 12 made of rigid metal such as a stainless steel, for example, is inserted into a gap 13 between the flexible circuit substrate 3 and the first CSP 1 and hold the flexible circuit substrate 3 between the supporter 12 and the heating stage 10. The thickness of the supporter 12 is made thinner than the height of the gap 13 so that the supporter can be easily inserted. Preferably, the thickness of the supporter 12 is equal to the length of the gap 13 between the first CSP 1 and the flexible circuit substrate 3 subtracted by a warp of the first CSP or less.

Figure 4B:
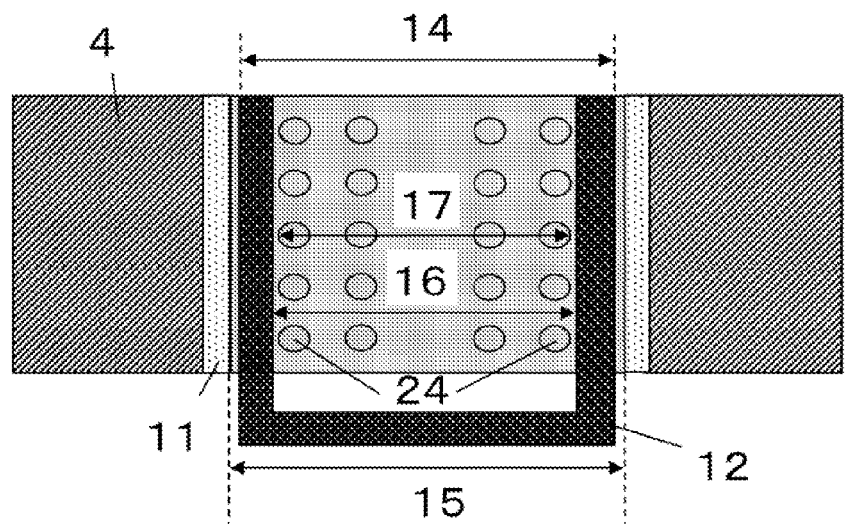

FIG. 4B is a plan view of the first CSP 1. The supporter 12 and the solder balls 24 between the first CSP 1 and the flexible circuit substrate 3 are also illustrated to explain the size relations.

The supporter 12 has a shape of a rectangle without one side. The supporter 12 is designed and made in the manner that an external size 14 of the supporter 12 is smaller than an external size 15 of the first CSP 1 and an inside size 16 of the supporter 12 is larger than a distance 17 from end to end of the outermost solder balls of the first CSP 1. Thus arm portions of the supporter 12 inserted into the region outside of the outermost solder ball lines (left line and right line) of the CSP 1 can be kept parallel and the folding position of the flexible circuit substrate 3 can be kept constant.

Figure 6:
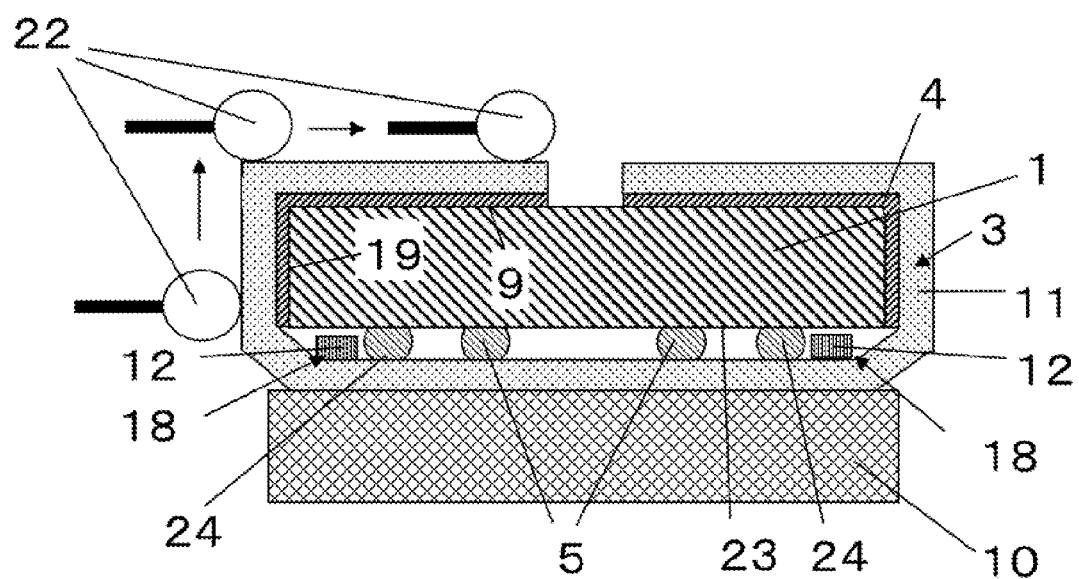
FIG. 6 is a schematic sectional view showing a manufacturing method of a semiconductor device according to an exemplary embodiment 1 of the present invention.

Next, as shown in FIG. 6, the flexible circuit substrate 3 is folded at the edge 18 of the supporter 12 keeping the supporter 12 inserted at a temperature 150 to 200 degree C. The adhesive layer 4 formed on the flexible circuit substrate 3 is adhered to lateral sides 19 and a side 9 of the first CSP 1 opposite to the side on which solder balls are mounted by applying a pressure of about 1 to 3 MPa using a pressing tool 22.

The adhesive layer 4 may also be formed on the lateral side 19 and the side 9 of the first CSP 1 opposite to the side on which solder balls are mounted to adhere the first CSP 1 and the flexible circuit substrate 3. However, it will be easy and therefore preferable to form the adhesive layer 4 on the flexible circuit substrate 3. Attaching a film type adhesive layer 4 may be possible to form the adhesive layer 4.

Figure 7:
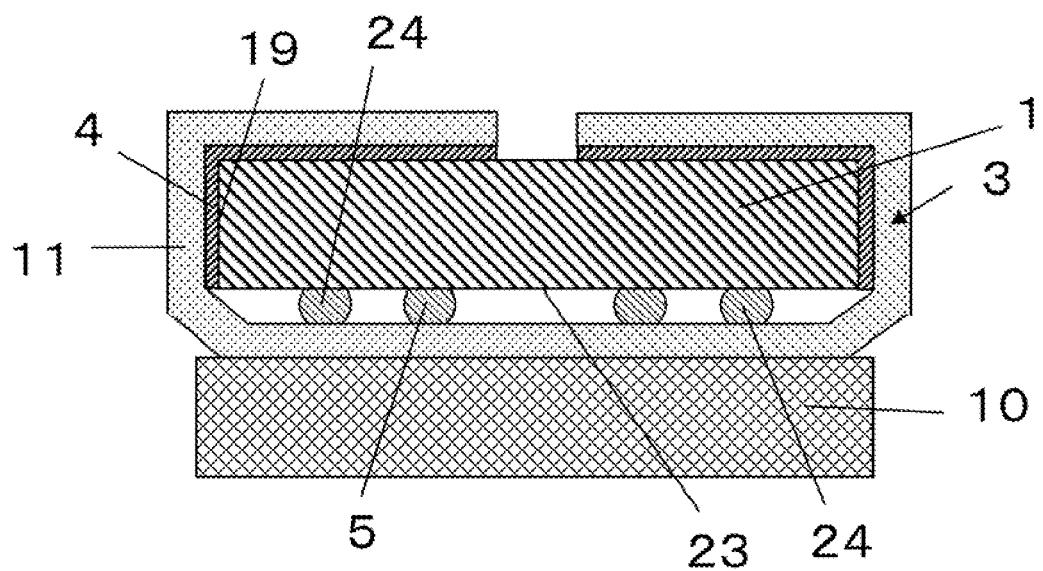
FIG. 7 is a schematic sectional view of a completed semiconductor device according to an exemplary embodiment 1 of the present invention.

Finally, the supporter 12 is drawn out to complete the semiconductor device (FIG. 7) according to an exemplary embodiment 1 of the present invention. A temperature of the supporter 12 or the flexible circuit substrate 3 is preferably cooled to equal to or lower than a glass transition temperature of the insulation layer (solder resist 6 in FIGS. 2A, 2B and 3A) of the flexible circuit substrate 3 before drawing out the supporter 12. For example, when using a solder resist 6 having a transition temperature of 70 degree C. in this exemplary embodiment 1, a temperature of the heating stage 10 may preferably be cooled down not more than 70 degree C. before drawing out the supporter 12. If the temperature of the heating stage 10 is the glass transition temperature of the solder resist 6 (150 to 200 degree C., for example, that is capable to adhere the adhesive layer 4 to the flexible circuit substrate 3) or more, the solder resist 6 is in a plastic condition. Thus, if the supporter 12 is drawn out when the solder resist 6 and the supporter 12 is in contact with each other, the surface of the solder resist 6 may be peeled or shaved. Such a trouble will be eliminated by cooling the heating stage 10 to the glass transition temperature or below and then drawing out the supporter 12.

The semiconductor device having the shape of the present invention may be fabricated easily and at low cost using the fabrication method of the present invention. Particularly, materials cost for fabrication of the semiconductor device can be reduced by drawing out the supporter finally.

Figure 29:
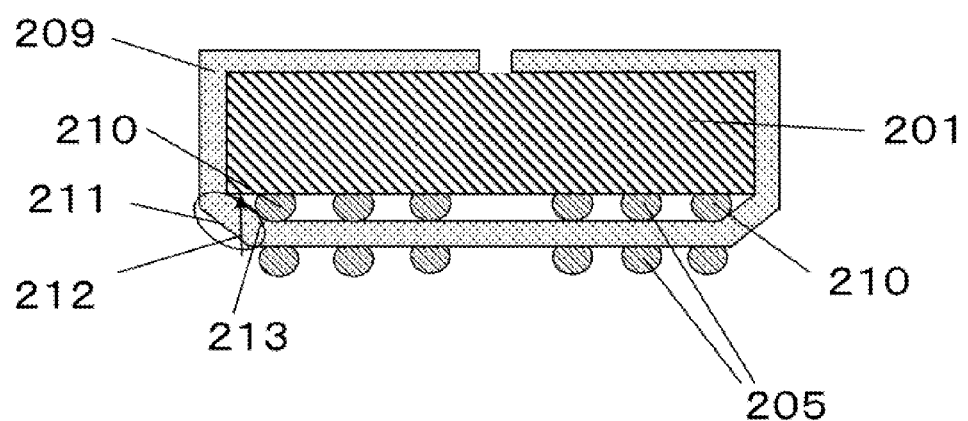
FIG. 29 shows a sectional view of a semiconductor device tried by inventor of the present invention that is similar to a semiconductor device of the present invention, in which a flexible circuit substrate is folded at an edge of the outermost solder balls.

When the flexible circuit substrate is folded without the supporter inserted between the CSP and the flexible circuit substrate, the flexible circuit substrate tends to become apart from the surface of the heating stage due to a force generated at the folding step towards the height direction of the solder balls. Then the flexible circuit substrate 209 is folded at the edge 213 of the outermost solder balls on the CSP 201 as shown in FIG. 29. The semiconductor device is fabricated with a residual stress (tension) 212 towards the height direction of the solder ball at an oval-circled portion of the flexible circuit substrate 211 as shown in FIG. 29. Therefore, the heights of the outermost solder balls 210 become smaller due to the stress when the solder balls are re-molten during a subsequent reflow step and the coplanarity of the CSP becomes bad (a coplanarity value becomes large).

Although it is not shown in FIG. 6, a non-adhesive layer made of a fluoro-resin such as a poly tetrafluoroethylene resin (PTFE), poly tetrafluoroethylene-perfluoroalkoxyethylen copolymer resin (PFA) or poly tetrafluoroethylene-hexafluoropropylene copolymer resin (FEP) may be formed on a surface of the supporter 12 that is in contact with the flexible circuit substrate 3. The non-adhesive layer enables preventing from adhesion of the surface of the flexible circuit substrate 3 and the surface of the supporter 12 and making the inserted supporter 12 easy to draw out from the device. Although the adhesive layer 4 is not formed on the area of the flexible circuit substrate 3 that is in contact with the supporter 12, the solder resist 6 as an insulation material of the flexible circuit substrate 3 acquires a weak adhesive capacity due to heating during the folding step of the flexible circuit substrate 3. The adhesive capacity disturbs the drawing out of the supporter 12, and the non-adhesive layer contributes to prevent adhesion of the solder resist 6 and the supporter 12.

Figure 5:
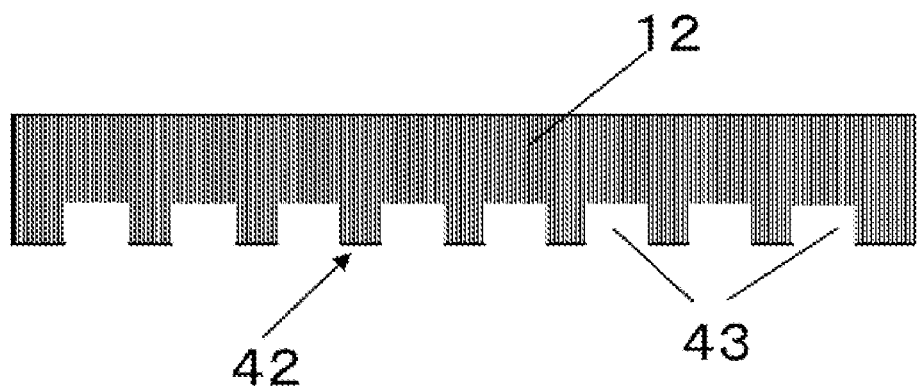
FIG. 5 shows a schematic sectional view of a supporter having grooves on a surface of it.

The contacting area between the flexible circuit substrate 3 and the supporter 12 may be reduced by forming grooves 43 on an area 42 on the supporter 12 that is in contact with the flexible circuit substrate 3 as shown in FIG. 5. It also reduces an adhesive capacity between the solder resist 6 on the flexible circuit substrate 3 and the supporter 12, and therefore the supporter 12 can be easily drawn out from the device.

Figure 8:
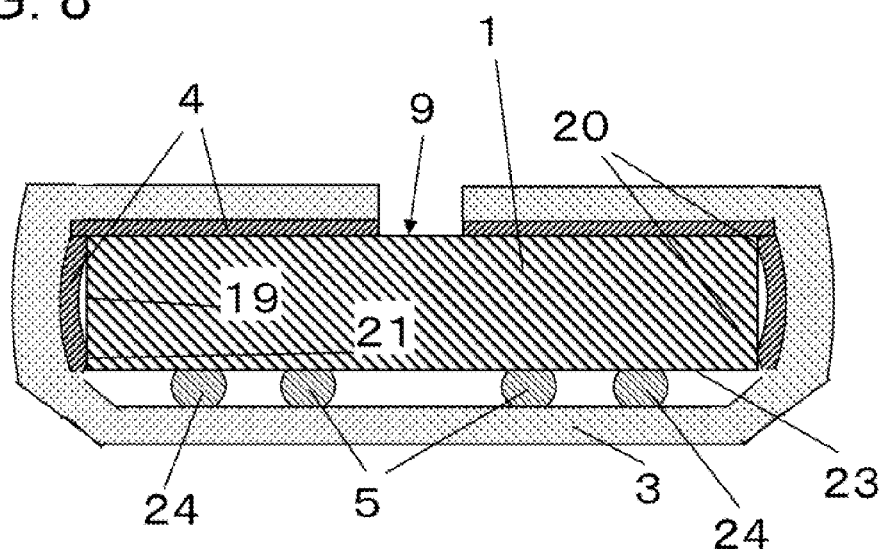
FIG. 8 is a schematic sectional view showing a variation of a semiconductor device according to an exemplary embodiment 1 of the present invention.

The flexible circuit substrate 3 is adhered to the whole lateral side 19 of the first CSP 1 by the adhesive layer 4 in FIG. 1A and FIG. 3. However, as shown in FIG. 8, it is not necessary to adhere the flexible circuit substrate 3 to the whole lateral side 19 of the first CSP 1. The coplanarity of the semiconductor device, in which the flexible circuit substrate 3 is adhered to the first CSP 1, may be improved enough by adhering a part 20 and/or 21 of the lateral side of the first CSP 1 as shown in FIG. 8. Particularly, when the flexible circuit substrate 3 is adhered to at least the region 21 of the lateral side of the first CSP 1 that is nearer to the side where solder balls are mounted, a good coplanarity may be obtained unless an underfill resin is not filled into a gap between the first CSP 1 and the flexible circuit substrate 3.

What is important to improve the coplanarity of the semiconductor device is to narrow an area where the flexible circuit substrate 3 is not fixed. The flexible circuit substrate 3 may be adhered to the whole lateral side 19 of the CSP by stopping the pressing tool 22 (shown in FIG. 6) at the position of the lateral side 19, for example, so as to keep a long pressing time during the step of folding the flexible circuit substrate 3 and adhering it to the lateral side 19 of the first CSP 1. However, when the pressing tool 22 cannot be stopped but continuously moved to reduce fabrication process time for a cost saving, the whole lateral side 19 of the first CSP 1 is not adhered to the flexible circuit substrate 3, and a part of the lateral side 19 of the CSP is adhered to the flexible circuit substrate 3 as shown in FIG. 8.

The flexible circuit substrate 3 connected to the first CSP 1 is folded at the area that is inside of the external edge of the CSP 1 and outside of the outermost solder balls of the CSP 1, that is, the flexible circuit substrate 3 is not folded at the edge of the outermost solder balls. Thus the tension loaded on the solder balls in the height direction of the CSP 1 can be much reduced, and therefore deformation of the flexible circuit substrate 3 when the solder balls are re-molten during the reflow step may be inhibited resulting in the semiconductor having a good coplanarity. In addition when the flexible circuit substrate 3 is folded at a position inside the external edge of the CSP 1 (inside position of the lateral side of the CSP 1), a force component directed to the inside of the CSP 1 is added at a portion of the flexible circuit substrate 3 that is in contact with the lateral side of the CSP 1. It also has an effect to make the flexible circuit substrate 3 easy to adhere to the lateral side of the CSP 1.

Other methods to prevent folding of the flexible circuit substrate 3 at the edge of the outermost solder balls 24 of the first CSP 1 of BGA type except the fabrication method as explained as an exemplary embodiment 1, that is, fabrication means without supporter 12, are described below.

Exemplary Embodiment 2

FIGS. 30 to 33 show a fabrication method of a semiconductor device according to an exemplary embodiment 2. In the figures fabrication steps are shown, in which a flexible circuit substrate 3 is connected to a first CSP 1 of BGA type, and then the flexible circuit substrate 3 is folded and adhered to a lateral side 19 of the CSP 1 and an opposite side 9 to a side of the CSP 1 where solder balls are mounted. The subsequent steps are omitted since they are the same as explained in an exemplary embodiment 1.

Figure 31:
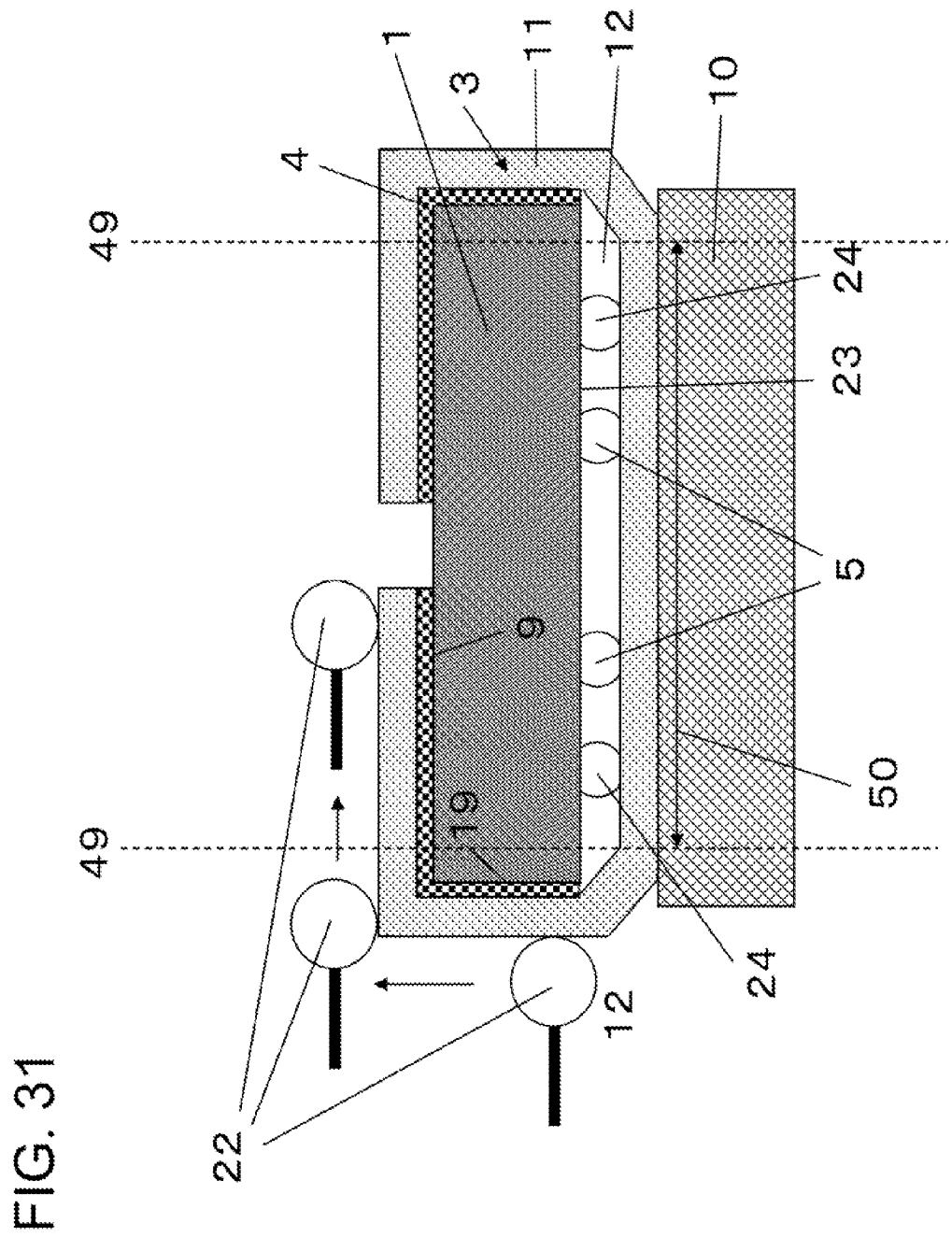
FIG. 31 is a schematic sectional view showing a manufacturing method of a semiconductor device according to an exemplary embodiment 2 of the present invention.

At first, the first CSP 1 of BGA type and the flexible circuit substrate 3 are connected by the solder balls 5 mounted on the CSP 1 (FIG. 30A). Next a sample device that the CSP 1 and the flexible circuit substrate 3 are connected is fixed on a heating stage 10 (FIG. 10B). A position where the flexible circuit substrate 3 is to be folded is denoted as 49 in FIG. 30B, and an area where the flexible circuit substrate is fixed on the heating stage is denoted as 50 in FIG. 31. Then the flexible circuit substrate 3 is folded at both edges of the area 50 where the flexible circuit substrate 3 is fixed, that is, at the positions 49 to be folded (the positions are set within an area inside an external portion of the CSP 1 and outside the outermost solder balls 24 on the CSP 1) with heating up to about 150 to 200 degree C. as explained in an exemplary embodiment 1 (a thermoplastic polyimide resin whose glass transition temperature is about 70 to 140 degree C. is used for an adhesive layer 4 in an exemplary embodiment 2). The flexible circuit substrate 3 is adhered to lateral sides of the CSP 1 and a side 9 of the CSP 1 opposite to a side where solder balls are mounted. A pressing tool 22 is used as shown in FIG. 31 as explained in an exemplary embodiment 1.

Figure 32:
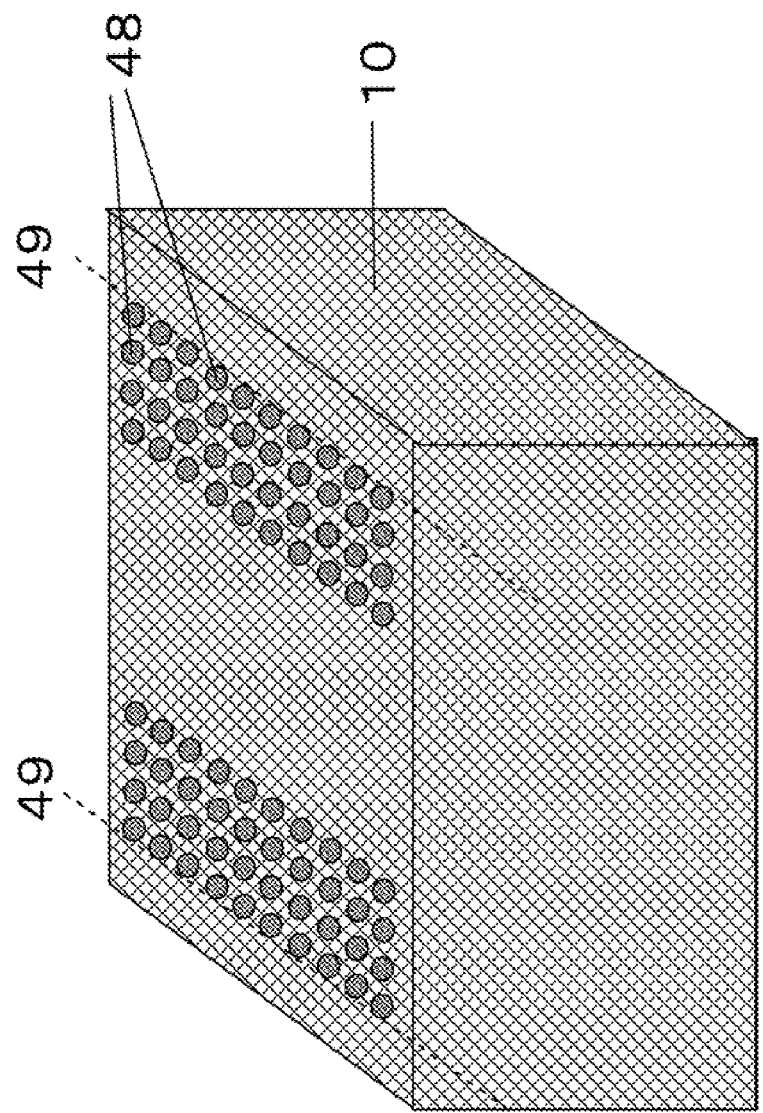
FIG. 32 is a perspective view of a heating stage used for manufacturing a semiconductor device according to an exemplary embodiment 2 of the present invention.
Figure 33:
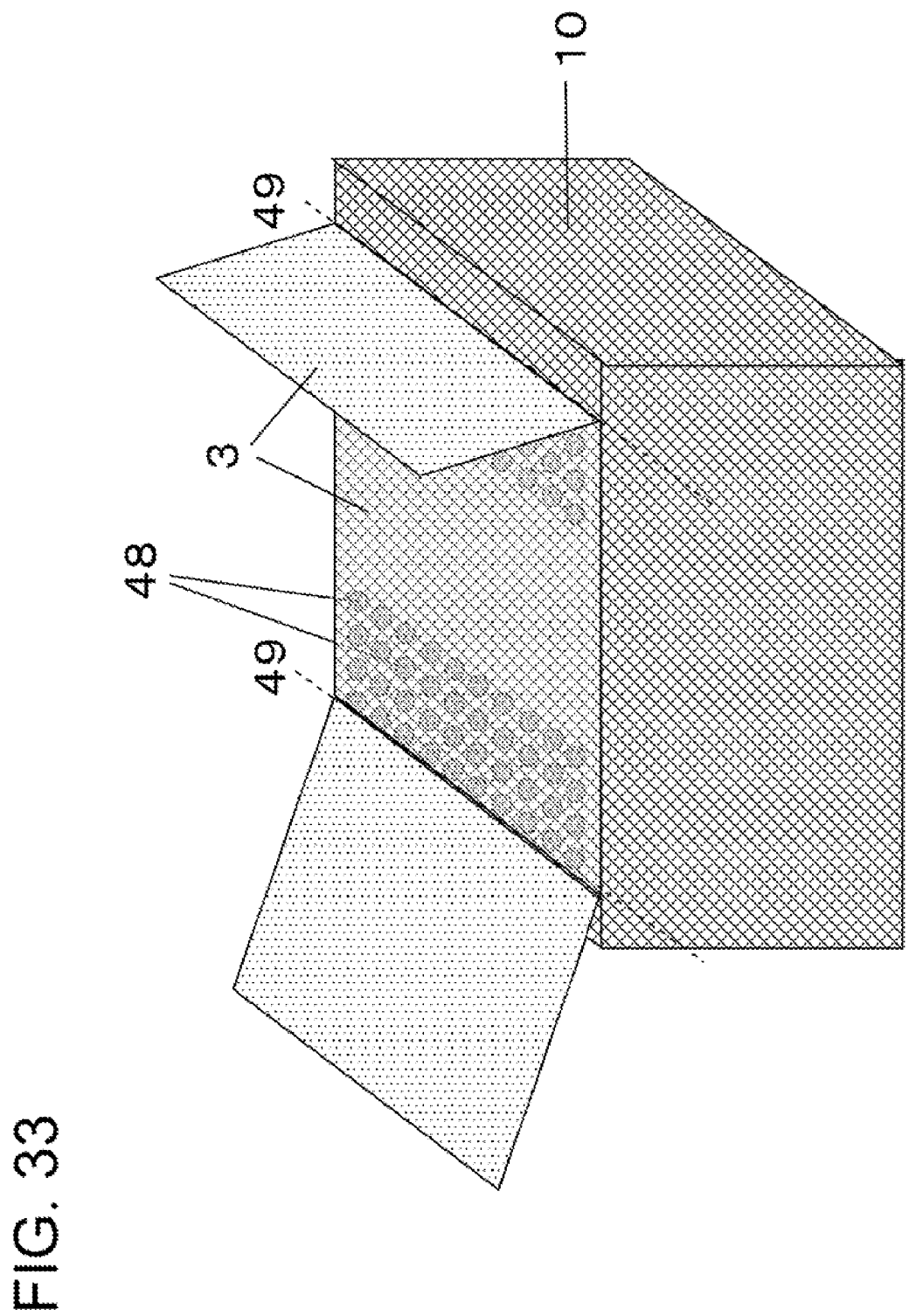
FIG. 33 is a perspective view of a flexible circuit substrate fixed and folded on a heating stage used for manufacturing a semiconductor device according to an exemplary embodiment 2 of the present invention (a semiconductor package connected on the flexible circuit substrate is omitted).

FIG. 32 shows the heating stage 10 used for fabrication method of an exemplary embodiment 2. Vacuum adsorption holes 48 are provided on the surface of the heating stage 10 to fix the flexible circuit substrate 3. A line of the outermost part of the holes 48 corresponds to the line 49 that the flexible circuit substrate 3 is to be folded. The flexible circuit substrate 3 can be folded at the line 49 to be folded by fixing the flexible circuit substrate 3 strongly with a high vacuum adsorption power as shown in FIG. 33 (the CSP 1 is not shown and vacuum adsorption holes 48 under the flexible circuit substrate 3 are shown for an easy comprehension in FIG. 33).

While a precise folding of the flexible circuit substrate 3 cannot be achieved by the method according to an exemplary embodiment 2 compared to the method according to an exemplary embodiment 1 (folding method using a supporter), the folding and adhesion process can be done within a shorter time since no supporter is used.

Exemplary Embodiment 3

Figure 34:
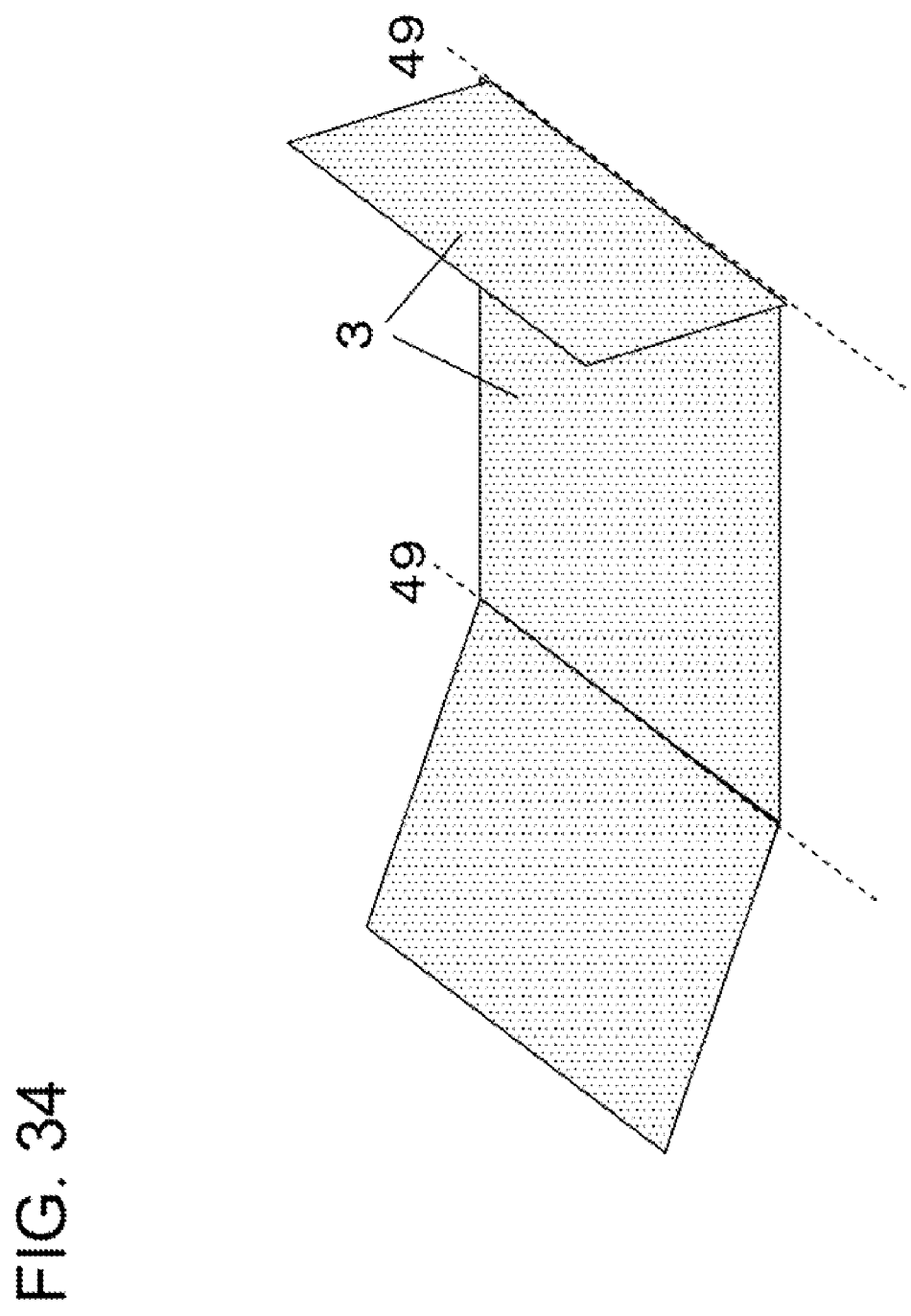
FIG. 34 is a perspective view showing a manufacturing method of a semiconductor device according to an exemplary embodiment 3 of the present invention, in which a crease is made on a flexible circuit substrate.
Figure 35A:
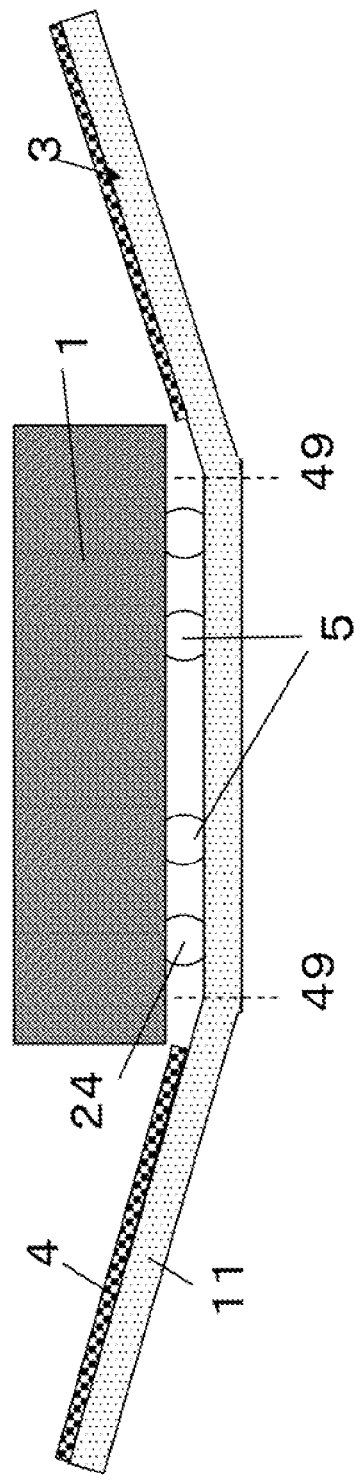
FIGS. 35A and 35B are schematic sectional views showing a manufacturing method of a semiconductor device according to an exemplary embodiment 3 of the present invention.
Figure 35B:
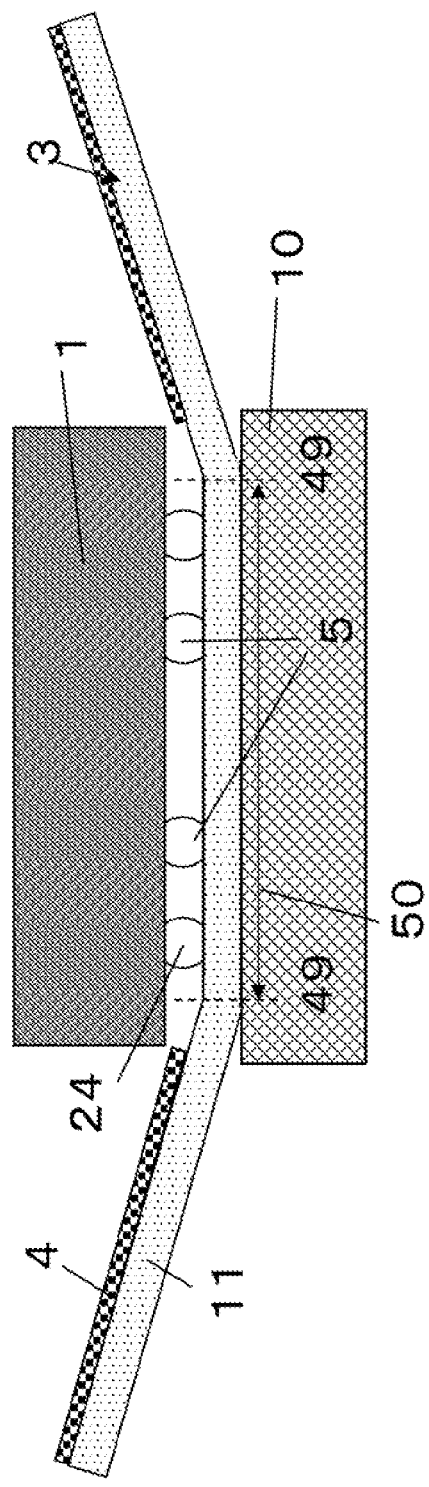
Figure 36:
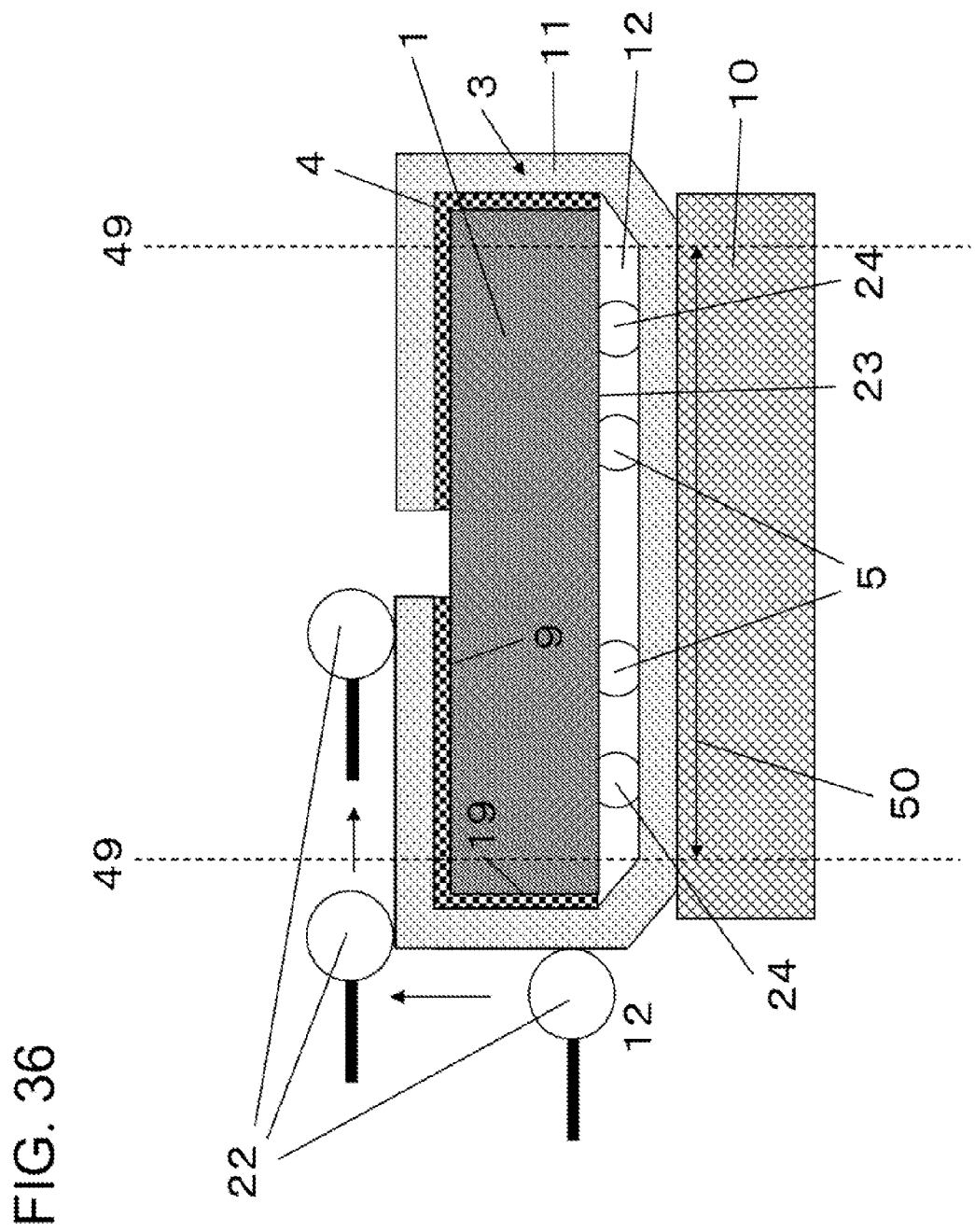
FIG. 36 is a schematic sectional view showing a manufacturing method of a semiconductor device according to an exemplary embodiment 3 of the present invention.

FIGS. 34 to 36 show a fabrication method of a semiconductor device according to an exemplary embodiment 3. In the figures fabrication steps are also shown, in which a flexible circuit substrate 3 is connected to a first CSP 1 of BGA type, then the flexible circuit substrate 3 is folded and adhered to a lateral side 19 of the CSP 1 and an opposite side 9 of the CSP 1 to a side where solder balls are mounted. The subsequent steps are omitted since they are the same as explained in an exemplary embodiment 1.

According to a fabrication method of an exemplary embodiment 3 of the present invention, creases are put on positions (lines) 49 to be folded on a flexible circuit substrate 3 using a tool such as a metal plate (not shown) (FIG. 34). This method is based on a fact that once a flexible circuit substrate is put a crease, the flexible circuit substrate can be easily bent again at the position of the crease. The folding position can be determined precisely by this method either.

Next the flexible circuit substrate 3 and the CSP 1 are connected by solder balls 5 mounted on the CSP 1 (FIG. 35A). Then the device that the flexible circuit substrate 3 and the CSP 1 are combined is fixed on a heating stage (FIG. 35B). A vacuum adsorption fixing method, for example, is preferably used for the fixation method. A position of the vacuum holes needs not to be set so precisely with the creasing position as explained in an exemplary embodiment 2 (FIG. 33). Once the crease was put on the flexible circuit substrate, the folding position becomes almost the same as the creasing position even when the vacuum adsorption position was slightly shifted.

Finally the flexible circuit substrate 3 is folded at the creasing positions again with heating up to about 150 to 200 degree C. as explained in exemplary embodiments 1 and 2 (a thermoplastic polyimide resin whose glass transition temperature is about 70 to 140 degree C. is used for an adhesive layer 4 in an exemplary embodiment 3), and the flexible circuit substrate 3 is adhered to lateral sides 19 of the CSP 1 and a side 9 of the CSP 1 opposite to a side where solder balls (external terminals) are mounted (FIG. 36).

According to the method of an exemplary embodiment 3, because creases are formed in advance on determined positions on the flexible circuit substrate 3 (an area on the flexible circuit substrate 3 after electrically connected to the CSP 1 that is inside an external edge of the CSP 1 and outside the outermost solder balls 24 on the CSP 1) using a tool such as a metal plate, for example, a preciseness of the folding of the flexible circuit substrate 3 may be improved compared to the method of exemplary embodiment 2.

Exemplary Embodiment 4

An exemplary embodiment 4 of the present invention will be explained, which has a similar structure to an exemplary embodiment 1 that was explained using FIGS. 1 to 3 but an adhesion method of a first CSP 1 and a flexible circuit substrate 3 is different.

Figure 9:
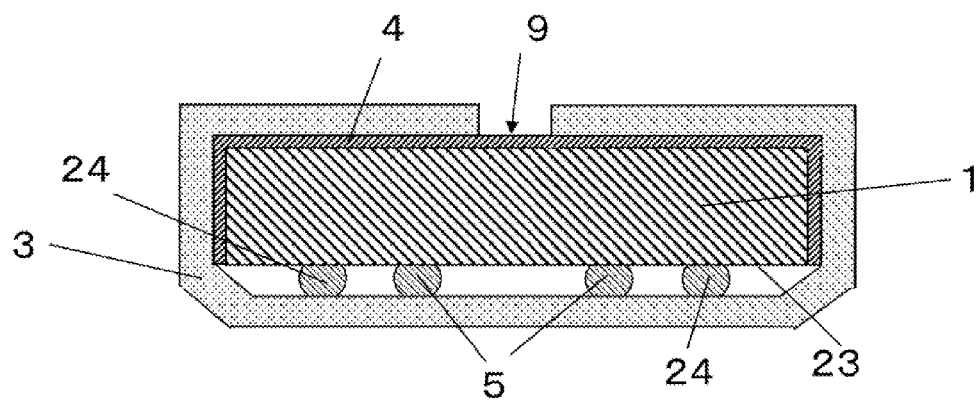
FIG. 9 shows a schematic sectional view of a semiconductor device according to an exemplary embodiment 4 of the present invention.
Figure 10:
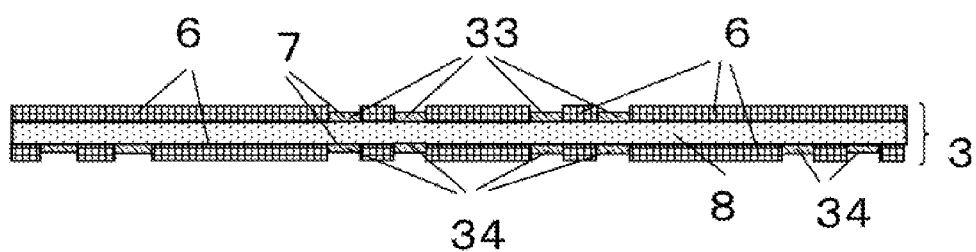
FIG. 10 shows a schematic sectional view of a structure of a flexible circuit substrate of an exemplary embodiment 4.

FIG. 9 shows a schematic sectional view of a semiconductor device according to an exemplary embodiment 4 of the present invention. FIG. 10 shows a schematic sectional view of a structure of a flexible circuit substrate 3 of an exemplary embodiment 4. An adhesive layer 4 is not formed on the flexible circuit substrate 3 of an exemplary embodiment 4 as shown in FIG. 10, which is different from an exemplary embodiment 1 of the present invention.

Figure 11A:
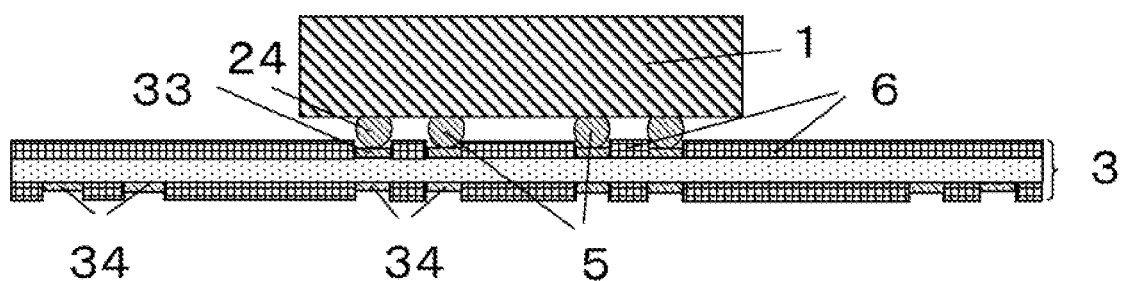
FIGS. 11A and 11B are schematic sectional views showing a fabrication method of a semiconductor device according to an exemplary embodiment 4 of the present invention.
Figure 11B:
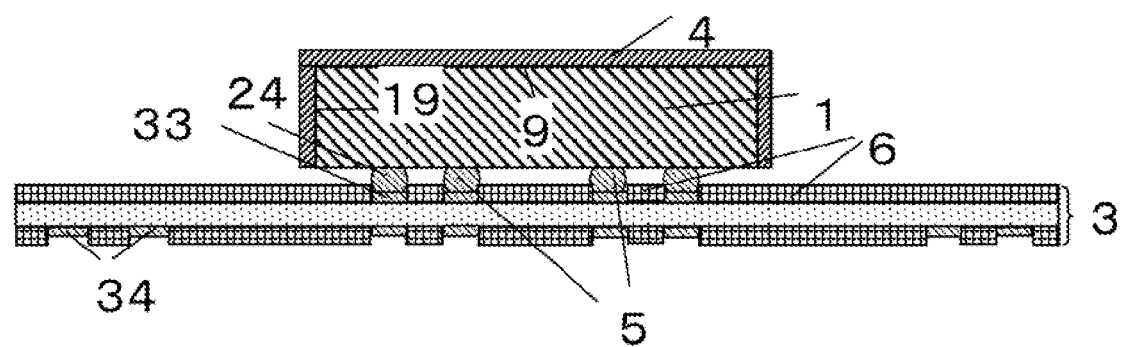

FIG. 11 is a schematic sectional view showing a fabrication method of a semiconductor device according to an exemplary embodiment 4 of the present invention. At first solder balls 5 on a first CSP 1 and first external terminals 33 on the flexible circuit substrate 3 are connected by a reflow method as shown in FIG. 11A. Next an adhesive layer 4 is formed on lateral sides 19 of the first CSP 1 and a side 9 opposite to a side where the solder balls are mounted as shown in FIG. 11B. The adhesive layer 4 may be formed by attaching a thermoplastic resin film or a thermosetting resin film before setting onto the lateral sides 19 of the first CSP 1 and the side 9 opposite to the side the solder balls are mounted within a short time (mot more than 10 seconds) with heating the first CSP 1 on a hot plate or by applying a liquid thermosetting resin onto the lateral sides 19 of the first CSP 1 and the side 9 opposite to the side the solder balls are mounted.

It becomes easy to process from the fabrication step of the flexible circuit substrate to adhesion step of the CSP to the flexible circuit substrate by using a thermoplastic resin as the adhesion layer because the flexible circuit substrate may be adhered to the CSP again by heating the thermoplastic resin up to the glass transition temperature or more after adhesion of the CSP to the flexible circuit substrate. An adhesion between the CSP and the thermoplastic resin will be improved by making the thermoplastic resin layer of 20 micrometers or more thickness because a standard roughness of a surface of the CSP is about 20 micrometers.

The steps after this step are omitted since they are the same as explained in FIGS. 3 to 7. When a film-type thermosetting resin before setting or liquid thermosetting resin is used for the adhesion layer 4, a thermosetting step is added. From the fabrication steps of the flexible circuit substrate to the adhesion step to the CSP may be executed easily by controlling a temperature history even when the thermosetting resin before setting was used for the adhesion layer. The adhesion between the CSP and the flexible circuit substrate may be improved by making the thermosetting resin layer by 20 micrometers or more in thickness because of the same reason explained above.

As explained above, a semiconductor device according to an exemplary embodiment 4 as shown in FIG. 9 can be fabricated by forming the adhesion layer 4 on the lateral sides 19 of the first CSP 1 and the side 9 of the CSP opposite to the side where solder balls are mounted instead of forming the adhesion layer 4 on the flexible circuit substrate 3 in advance. Generally, an attaching step of a film type adhesion layer can be included in the fabrication steps of the flexible circuit substrate, and therefore this method is suitable for mass production and reduction of fabrication cost of the semiconductor device.

Exemplary Embodiment 5

FIGS. 12A, 12B and 12C show schematic sectional views of a semiconductor device according to an exemplary embodiment 5 of the present invention. The semiconductor device according to an exemplary embodiment 5 of the present invention is a three dimensionally stacked-type semiconductor device in which both the semiconductor device according to an exemplary embodiment 1 or 4 of the present invention as shown in FIG. 1A, 8 or 9 and a second CSP 2 are combined.

Figure 13A:
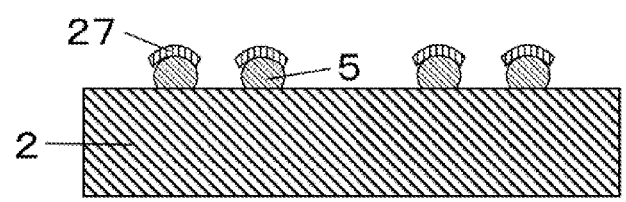
FIGS. 13A and 13B are schematic sectional views showing a fabrication method of a semiconductor device according to an exemplary embodiment 5 of the present invention.

FIGS. 13 to 15 show a fabrication method of a semiconductor device according to an exemplary embodiment 5 of the present invention. The explanation assumes that the semiconductor device according to an exemplary embodiment 1 shown in FIG. 1A and the second CSP 2 are combined.

At first flux 27 is applied on solder balls 5 of the second CSP 2 (FIG. 13A), and the flux 27 is also applied on external terminals 7 on the side of the flexible circuit substrate 3 adhered to the side 9 opposite to the side where solder balls are mounted (FIG. 13B) in the semiconductor device 28 (shown in FIG. 1A) according to an exemplary embodiment 1 of the present invention. Next the semiconductor device 28 according to an exemplary embodiment 1 of the present invention is stacked on the second CSP 2 (FIG. 14A) after positioning the solder balls 5 of the second CSP 2 and the external terminals 7 (not shown in the figure) of the semiconductor device 28 according to an exemplary embodiment 1. Then flux 27 are applied on external terminals 7 (not shown) on the flexible circuit substrate 3 that are formed on the side to the solder balls 5 of the first CSP 1 (FIG. 14B) and solder balls are preliminary mounted on the external terminals 7 on which the flux are applied (FIG. 15A). Finally, the semiconductor device according to an exemplary embodiment 5 of the present invention has completed (FIG. 15B) after connecting the solder balls 5 and the external terminals 7 on the flexible circuit substrate 3 by a reflow method and flushing the flux 27 by an organic solvent.

The first CSP 1 and the second CSP 2 are illustrated as the same CSPs in FIGS. 12 to 15. However, it is needless to say that different kinds of CSPs may be used as the first CSP 1 and the second CSP 2.

Exemplary Embodiment 6

Figure 16:
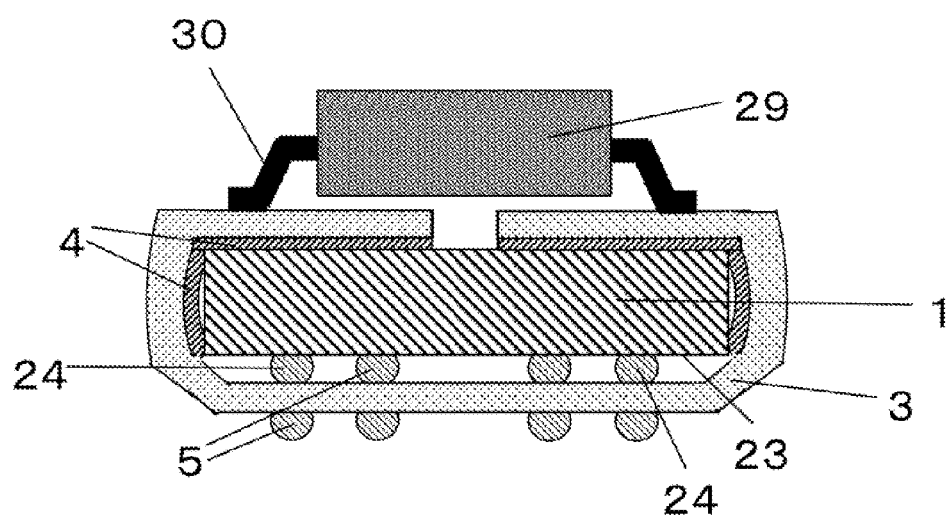
FIG. 16 shows a schematic sectional view of a semiconductor device according to an exemplary embodiment 6 of the present invention.

FIG. 16 shows a schematic sectional view of a semiconductor device according to an exemplary embodiment 6 of the present invention. An exemplary embodiment 6 of the present invention is a three dimensionally stacked semiconductor device that is similar to an exemplary embodiment 5 of the present invention shown in FIG. 12A. However, the device is different from an exemplary embodiment 5 on a point that the device is a three dimensionally stacked semiconductor device composed by stacking the semiconductor device according to an exemplary embodiment 1 of the present invention shown in FIG. 8 and a semiconductor package 29 excepting a BGA-type semiconductor device. As shown in this embodiment, the semiconductor device according to the present invention is not necessarily composed of only BGA-type chip size packages but a package having lead terminals 30 as external terminals 7 may be stacked as shown in FIG. 16.

Exemplary Embodiment 7

Figure 17:
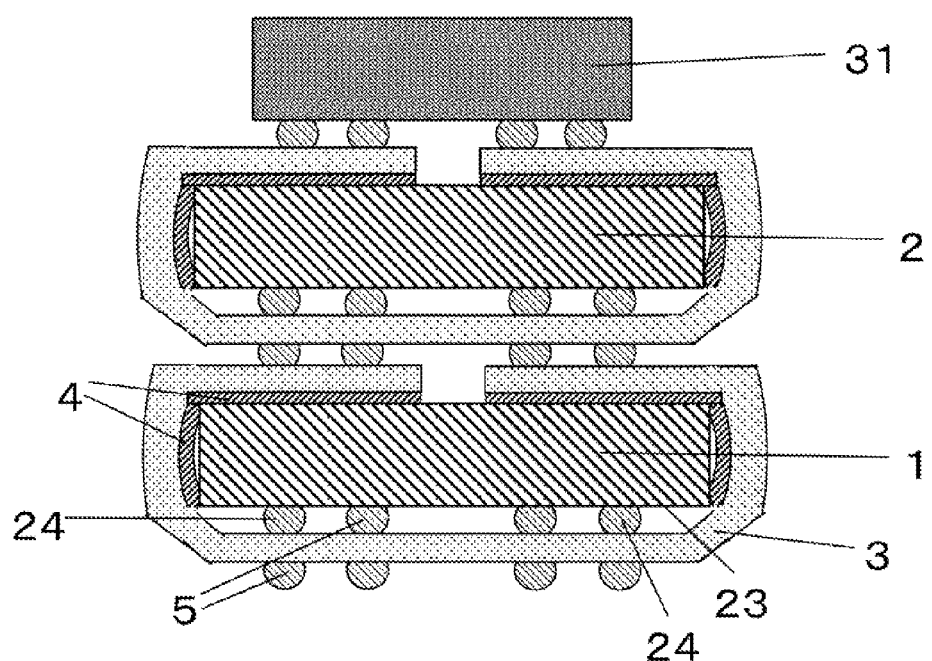
FIG. 17 shows a schematic sectional view of a semiconductor device according to an exemplary embodiment 7 of the present invention.

FIG. 17 shows a schematic sectional view of a semiconductor device according to an exemplary embodiment 7 of the present invention. The structure of an exemplary embodiment 7 shown in FIG. 17 is similar to an exemplary embodiment 5 shown in FIG. 12. However, the example shows a three dimensionally stacked semiconductor device that two semiconductor devices according to the present invention and one other semiconductor package are stacked (two semiconductor devices according to an exemplary embodiment 1 shown in FIG. 8 and a different kind of third CSP 31 are stacked three-dimensionally in FIG. 17).

The semiconductor device that three devices are stacked three dimensionally as an exemplary embodiment 7 according to the present invention may be applied to an electronic apparatus that a mounting height specification is not so strict (not more than 10 mm, for example).

Although an exemplary example 7 shows a semiconductor device that three devices are stacked, a semiconductor device stacking more than three devices may be conceivable using a plurality of semiconductor devices according to the present invention (as shown in FIGS. 1A, 8 and 9) when a mounting height of the device was within a specification.

Although the first CSP 1 and the second CSP 2 in FIG. 17 are illustrated to be the same, they may have different external sizes. Also when using more than three devices (CSPs and/or devices other than CSP), all of them may be different or may include the same devices.

Exemplary Embodiment 8

Figure 18:
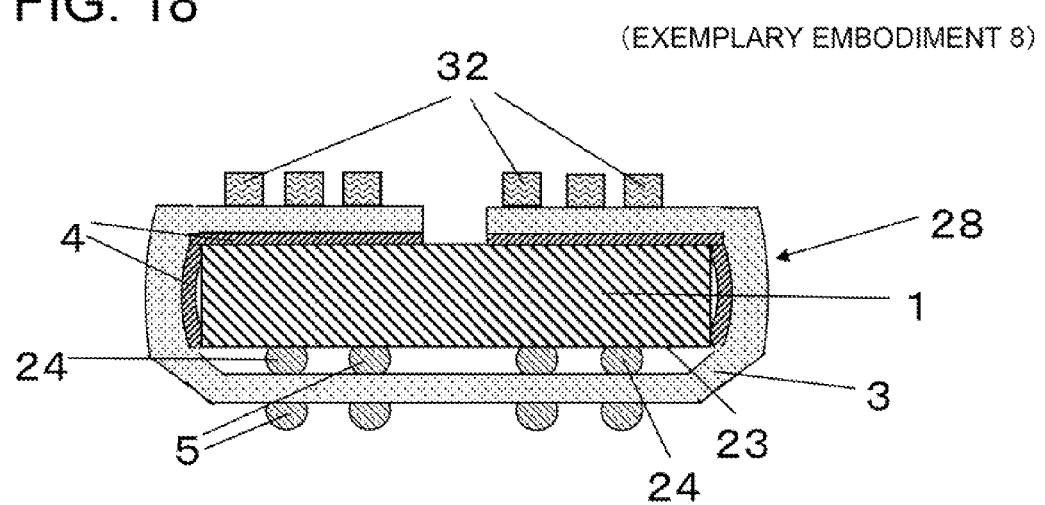
FIG. 18 shows a schematic sectional view of a semiconductor device according to an exemplary embodiment 8 of the present invention.

FIG. 18 shows a schematic sectional view of a semiconductor device according to an exemplary embodiment 8 of the present invention. The structure of an exemplary embodiment 7 shown in FIG. 18 is similar to an exemplary embodiment 5 shown in FIG. 12. However, the example has a feature that the device according to an exemplary embodiment 1 (or 2) of the present invention and passive components (capacitor, resistor and/or inductor) 32 are stacked (the semiconductor device according to an exemplary embodiment 1 shown in FIG. 8 is used in FIG. 18).

While a required area for a single passive component 32 mounted around a semiconductor package is small, a total mounting area for such passive components 32 is almost the same or sometimes larger than a mounting area for the semiconductor packages and it may take much part of a possible mounting area on a mother board because the number of the passive components are large. In such a case the required mounting area for the passive components 32 on the mother board can be reduced by using the structure according to an exemplary embodiment 8 of the present invention.

When fabricating a three dimensionally stacked semiconductor package containing a plurality of semiconductor devices and passive components (capacitor, resistor and/or inductor), by including at least one CSP according to the present invention in the package, a manufacturer can have a wide variety of selection of such packages and reduce an inspection cost greatly at the same time. Therefore, even an apparatus/component maker instead of a semiconductor maker can fabricate various kinds of small and low-cost semiconductor devices. Also by mounting the semiconductor devices according to the present invention on a circuit substrate or module substrate, the size of the circuit substrate or module substrate can be minimized and realize a cost reduction.

The circuit substrate or module substrate mounting the (three dimensionally stacked type) semiconductor devices according to the present invention may contribute to achieve downsizing, cost reduction and enhancing a performance of an electronic apparatus such as a mobile phone, personal computer, car navigator, on-vehicle module or game player, and so on.

Exemplary Embodiment 9

Figure 19:
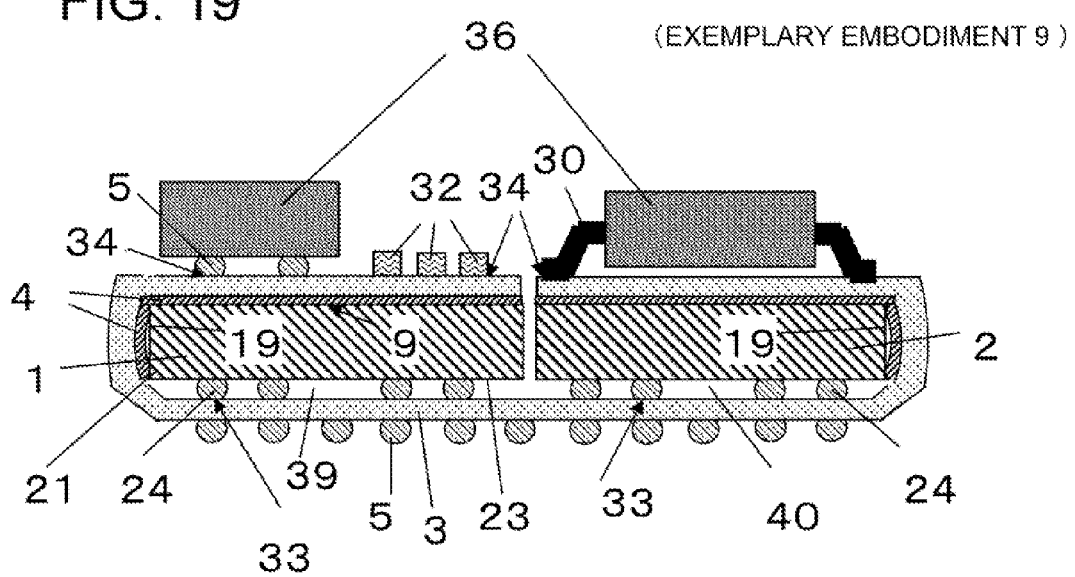
FIG. 19 shows a schematic sectional view of a semiconductor device according to an exemplary embodiment 9 of the present invention.

FIG. 19 shows a schematic sectional view of a semiconductor device according to an exemplary embodiment 9 of the present invention. Differently from the semiconductor devices described as exemplary embodiments 1 to 8, an exemplary embodiment 9 of the present invention shown in FIG. 19 has a feature that a plurality of CSPs are mounted on first external terminals 33 of a flexible circuit substrate 3 (two CSPs 1 and 2 can be seen on one flexible circuit substrate 3 in FIG. 19). The flexible circuit substrate 3 is folded and adhered to a side 9 opposite to a side 23 where solder balls of the CSP are mounted and semiconductor packages 36 and passive components (capacitor, resistor and/or inductor) 32 are mounted on second external terminals 34 of the flexible circuit substrate 3.

Figure 20:
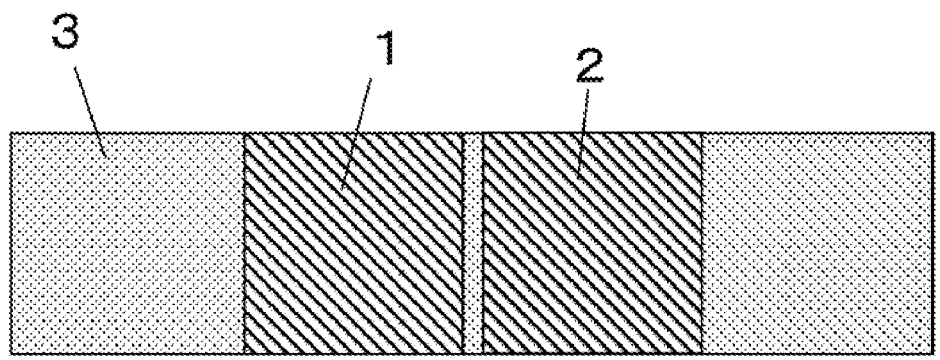
FIG. 20 shows a plan view of a semiconductor device according to an exemplary embodiment 9 of the present invention, in which two CSPs are mounted on a flexible circuit substrate.
Figure 21:
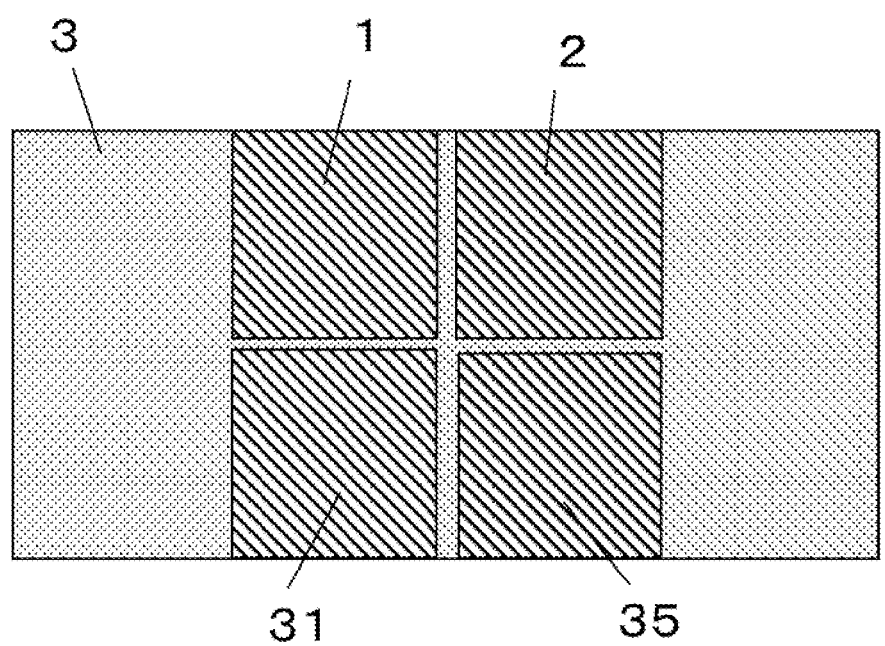
FIG. 21 shows a plan view of a semiconductor device according to an exemplary embodiment 9 of the present invention, in which four CSPs are mounted on the flexible circuit substrate.

FIG. 19 illustrates that two CSPs (first CSP 1 and second CSP 2) are mounted on the external terminals 33 of one flexible circuit substrate 3 as shown in a plan view of FIG. 20. However, a number of CSPs mounted on the flexible circuit substrate 3 is not limited to two but can be four (first CSP 1, second CSP 2, third CSP 31 and forth CSP 35) as shown in a plan view of FIG. 21, and also the number of CSPs mounted on the external terminals 33 of one flexible circuit substrate 3 can be three or five or more (not shown).

Figure 22:
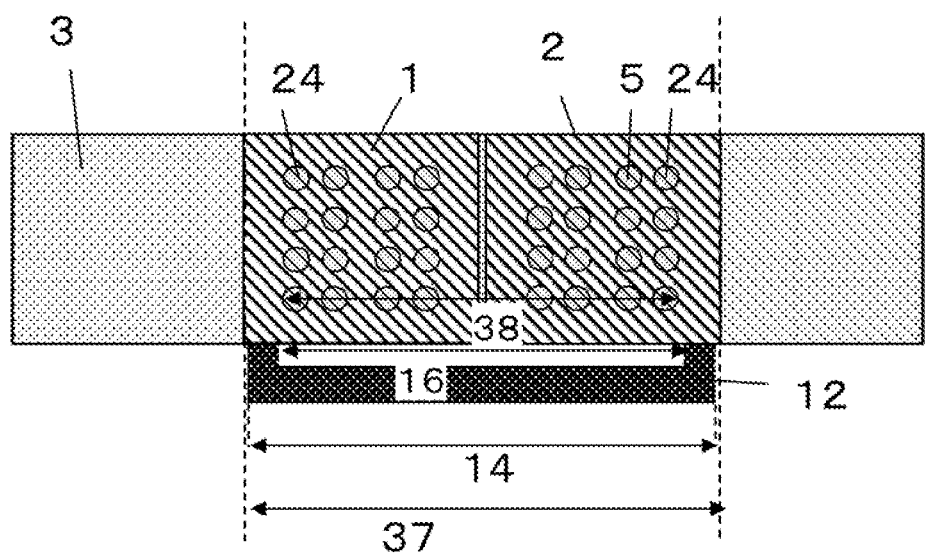
FIG. 22 shows a plan view from an opposite side of a CSP to a side on which solder balls are mounted at a manufacturing step of a semiconductor device according to an exemplary embodiment 9 of the present invention, in which a supporter is inserted between a CSP and a flexible circuit substrate.

When fabricating the semiconductor device according to an exemplary embodiment 9, a supporter 12 is inserted in a gap between the CSPs (first CSP 1 and second CSP 2 in FIG. 22, for example) and the flexible circuit substrate 3 as shown in FIG. 22 (while the figure shows a plan view from a side of the side 9 opposite to the side 23 where solder balls are mounted, positions of the solder balls are indicated for easy understanding).

Back to FIG. 19, a thickness of the supporter 12 preferably be thinner than a smaller gap of a gap 39 between the first CSP 1 and the flexible circuit substrate 3 and a gap 40 between the second CSP 2 and the flexible circuit substrate 3 so that the supporter 12 can be inserted easily in the gap between the first and second CSPs 1 and 2 and the flexible circuit substrate 3. More preferably, the thickness is not more than a size of the smaller gap subtracted by a larger warp of the first CSP 1 or the second CSP 2.

An outer size 14 of the supporter 12 is designed and formed to be smaller than a width 37 from an outer edge of the first CSP 1 to an outer edge of the second CSP 2. Also an inside size 16 of the supporter 12 is designed and formed to be larger than a length 38 from an edge of the outermost solder balls 24 of the first CSP 1 to an edge of the outermost solder balls 24 of the second CSP 2.

Figure 23A:
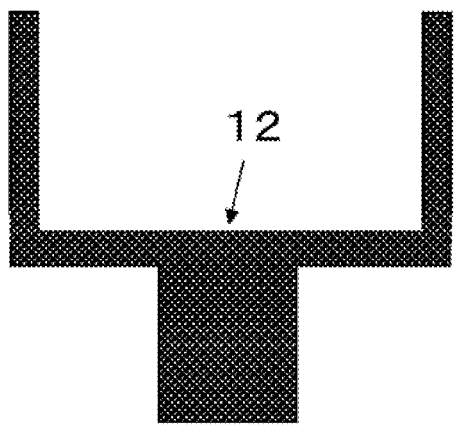
FIGS. 23A and 23B show two kinds of shapes of a supporter.
Figure 23B:
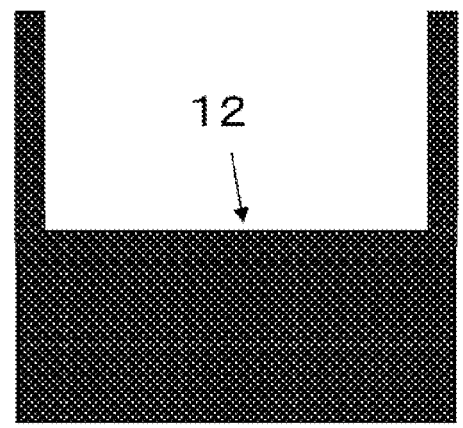

As for a shape of the supporter 12, it is not limited to the shape as shown in FIG. 22 or 4B, as is applied for fabricating every semiconductor device as well as the semiconductor device of an embodiment 9 according to the present invention. If at least the top portion of the supporter 12 that is inserted into the gap between the CSP and the flexible circuit substrate 3 is a rectangle from which one side is removed, a shape of the opposite side may be formed like shown in FIGS. 23A and 23B, for example.

A fabrication method of an exemplary embodiment 9 is omitted since it is the same as that of an exemplary embodiment 1 as shown in FIG. 3.

The CSPs connected to the first external terminals 33 of the flexible circuit substrate 3 are illustrated as the same CSP in FIGS. 19 to 22. However, they are not necessarily the same but can be different CSPs having different external sizes or can include same CSPs in part.

It should be noted that the present invention is not limited to the foregoing exemplary embodiments and modifications may be done without departing the gist and scope of the present invention as disclosed herein and claimed as appended herewith.

EXAMPLES

Some examples according to the present invention will be explained in detail with reference to the drawings attached but the present invention is not limited to the examples below.

Example 1

An example 1 of the present invention will be explained with reference to FIGS. 1 to 7, 12, 13 to 15 and 24.

Figure 24:
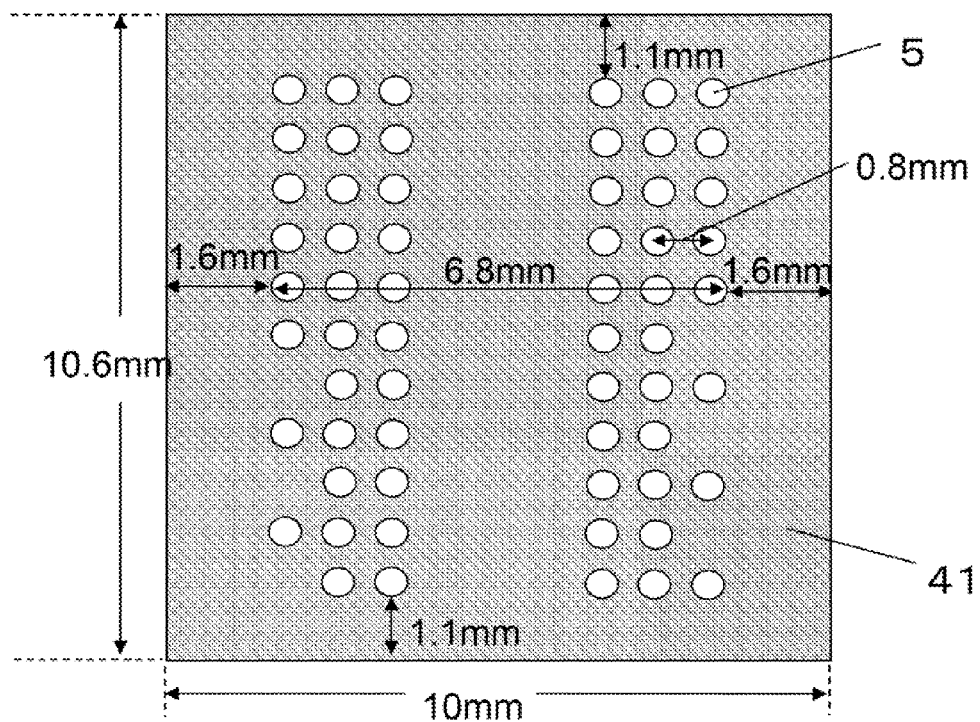
FIG. 24 is a plan view of a CSP used for an example 1 of the present invention shown from a side solder balls are mounted.

Two CSPs (external size: 10 mm×10.6 mm, package height: 1.2 mm, pitch of solder ball: 0.8 mm, diameter of solder ball: 0.45 mm, material of solder ball: SnAgCu, number of input terminals: 60) mounting a 512 Mbit DDR2 (Double-Data-Rate)-SDRAM (Synchronous-Dynamic-Random-Access-Memory) chip as shown in FIG. 24 were prepared. They are referred to as a first CSP 1 and a second CSP 2.

A flexible circuit substrate 3 has a structure shown in FIG. 2A. An interlayer insulation layer 8 is made of a polyimide of thickness 25 micrometers and copper foil patterns of 12 micrometers thickness were formed on both sides of the polyimide. And first external terminals 33 and second external terminals 34 were formed on positions where solder resist 6 was removed. The solder resist was formed by a screen printing method. A material having a 10 micrometers thickness and about 90 degree C. glass transition temperature and causes no deterioration by a reflow step of 10 seconds at 260 degree C. was used for the solder resist 6. A nickel film of 3 micrometers thickness and a gold film of 0.03 micrometer thickness on the nickel film were formed (not shown in figures) on both surfaces of the first external terminals 33 and the second external terminals 34 by an electroless plating method. The copper foil patterns on both sides of the polyimide (interlayer insulation layer 8) were connected by vias (not shown in FIG. 2A).

An adhesive layer 4 of the flexible circuit substrate 3 in FIG. 2A to adhere the flexible circuit substrate 3 to a lateral side 19 of the CSP and a side 9 opposite to a side where solder balls are mounted was formed by attaching a thermoplastic polyimide sheet of 40 micrometers thickness using a heat press machine at a corresponding area on a solder resist 6 of the flexible circuit substrate 3. A material having a glass transition temperature about 70 degree C. was used for the thermoplastic polyimide sheet so that the flexible circuit substrate 3 can be adhered at a relatively low temperature from 150 to 200 degree C. Because the inventor had found that characteristics of the DDR2-SDRAM was deteriorated by keeping the DDR2-SDRAM in a high temperature atmosphere to 250 degree C. or more. Thus the adhering temperature of the CSP and the flexible circuit substrate 3 is preferably not more than 200 degree C. including a safety margin so that the DDR2-SDRAM is kept away from high temperature atmosphere as far as possible to prevent deterioration by heat.

Next the flexible circuit substrate 3 was fixed on a stage of a flip-chip attach mounter by a vacuum adsorption and a flux was applied on the first external terminals 33 of the flexible circuit substrate 3 (not shown in FIG. 3A). Then the positions of the solder balls 5 of the first CSP 1 (DDR2-SDRAM-CSP) and the first external terminals 33 were aligned using a camera provided on the flip-chip attach mounter and the CSP 1 was pre-fixed with a low lord about 100 g (see FIG. 3A, the stage of the flip-chip attach mounter is not shown in FIG. 3A). Heat was not applied in this pre-fixation step. The sample device was removed from the flip-chip attach mounter and the first CSP 1 and the flexible circuit substrate 3 were connected (molten attached) in a reflow furnace. After withdrawal from the reflow furnace the sample device was flushed by a methyl ethyl ketone (organic solvent) and dried out finally.

The sample device was moved to an apparatus for folding the flexible circuit substrate 3 and adhering to the first CSP 1, fixed on a heating stage 10 of the apparatus by a vacuum adsorption and the heating stage was heated up to 180 degree C. (FIG. 3B).

Next a supporter 12 made of SUS 304 was inserted into a gap between the first CSP 1 and the flexible circuit substrate 3. The flexible circuit substrate 3 was sandwiched between the supporter 12 and the heating stage 10 (FIGS. 4A and 4B). A size of a gap 13 between the first CSP 1 and the flexible circuit substrate (FIG. 4A) was 0.27 mm and a warp of the first CSP 1 was about 0.05 mm. Therefore, a thickness of the supporter 12 was determined as 0.20 mm because the distance of the gap 13 (0.27 mm) was subtracted by the warp (0.05 mm) and the result (0.22 mm) was again subtracted by a fabrication tolerance.

Figure 25:
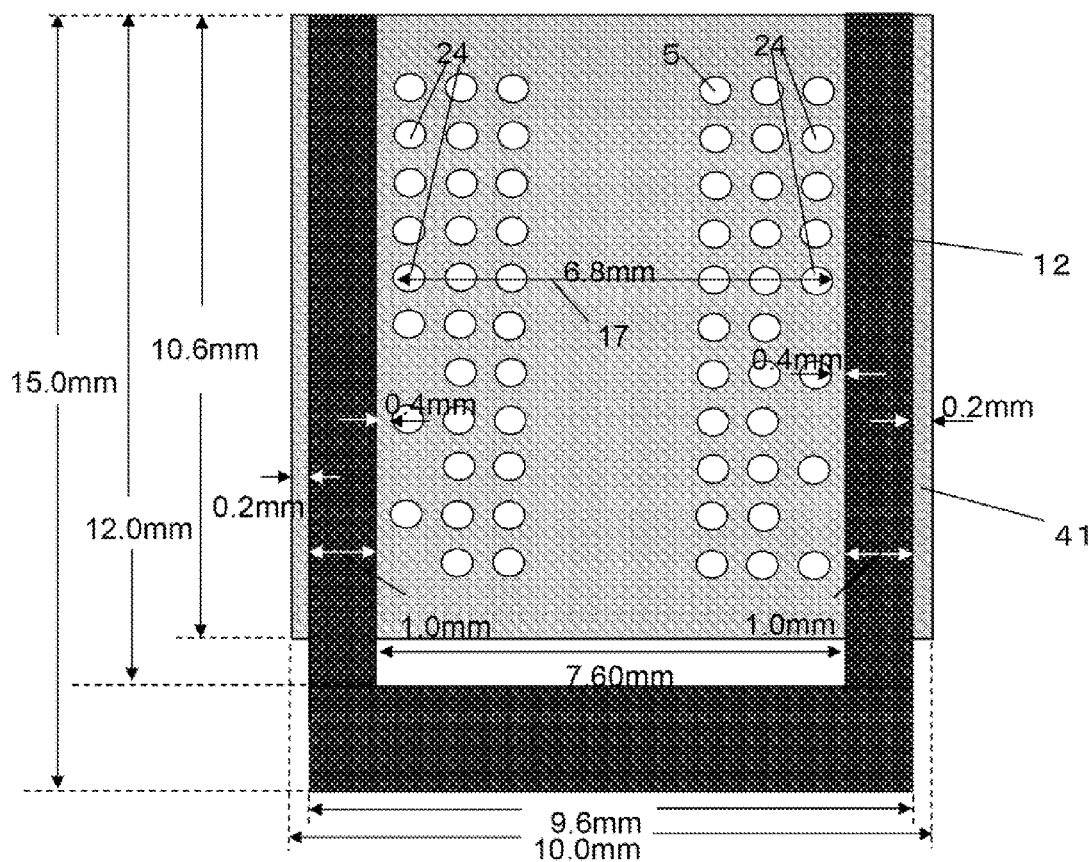
FIG. 25 is a plan view of a first CSP 1 shown from a side solder balls are mounted, in which a supporter is set on the CSP 1.

FIG. 25 is a plan view of the supporter 12 set on a side 23 of the first CSP 1 where solder balls are mounted, in which external sizes of the supporter 12 were also shown. The supporter 12 has a shape of a rectangle without one side and the external sizes are 9.6 mm of external width (0.4 mm smaller than the external size of the CSP of 10.0 mm), 7.6 mm of inside width (0.8 mm larger than the distance 17 (6.8 mm) from one edge of the outermost solder balls of the CSP to the other) and 12.0 mm of length of each of two support portions (1.4 mm longer than the CSP length of 10.6 mm).

Figure 26:
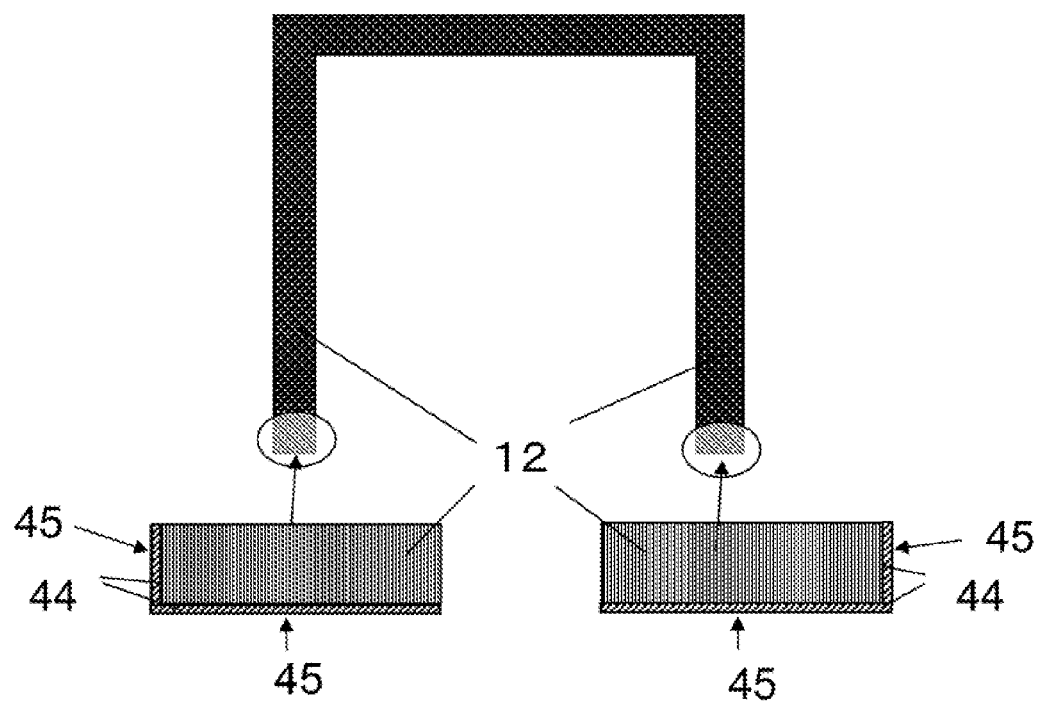
FIG. 26 shows a plan view and sectional views indicating a position of Teflon (trademark registered) coating on a supporter.

Surfaces 45 of the supporter 12 that are in contact with the flexible circuit substrate 3 are coated with Teflon® (registered trade mark) coating 44 of 10 micrometers thick (Teflon is a main example of a non-adhesive layer 44) as shown in FIG. 26 (upper is a plan view and lowers are sectional views). The thickness and external widths of the supporter explained above include the thickness of the Teflon® coating 44.

Next the flexible circuit substrate 3 was folded at the edges of the supporter 12 with keeping the supporter inserted and keeping the temperature 180 degree C., and the adhesive layer 4 (thermoplastic polyimide) formed on the flexible circuit substrate 3 was adhered to the lateral side(s) 19 of the CSP and the side 9 opposite to the side where solder balls are mounted with a pressure of 2 MPa (FIG. 6). A pressing tool 22 having a metal rod at a center thereof and covered by a silicone rubber was used.

Then the heating stage was cooled down from 180 to 60 degree C. and the supporter 12 was drawn out to complete the semiconductor device shown in FIG. 1A.

Figure 13B:
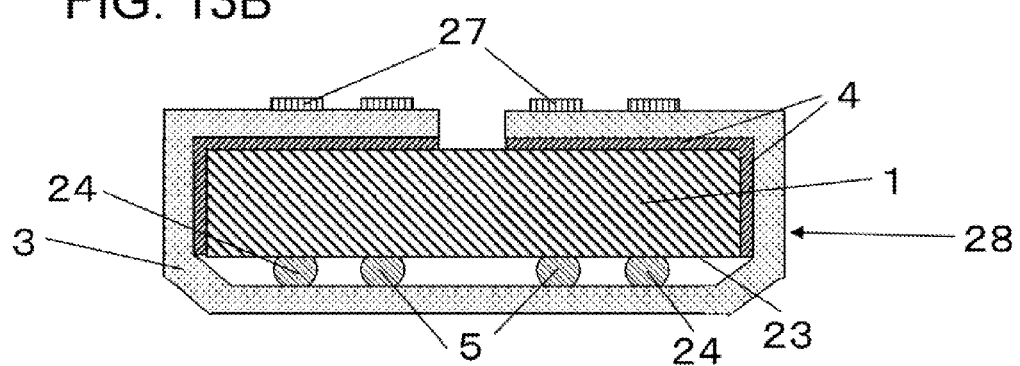

Next a flux 27 was applied on solder balls 5 of a second CSP 2 (FIG. 13A), and a flux was also applied on external terminals 7 (not shown) in the flexible circuit substrate 3 of the semiconductor device 28 fabricated above on a side of the side 9 opposite to the side 23 where the solder balls are mounted (FIG. 13B).

Figure 14A:
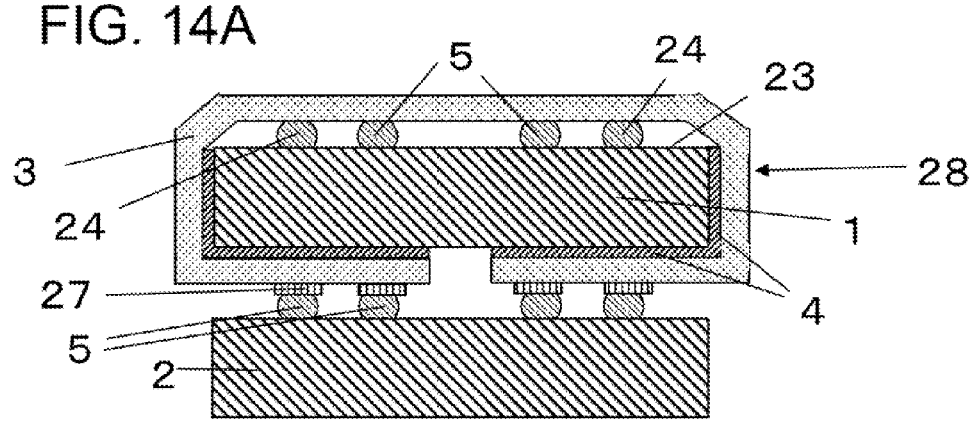
FIGS. 14A and 14B are schematic sectional views showing a fabrication method of a semiconductor device according to an exemplary embodiment 5 of the present invention.
Figure 14B:
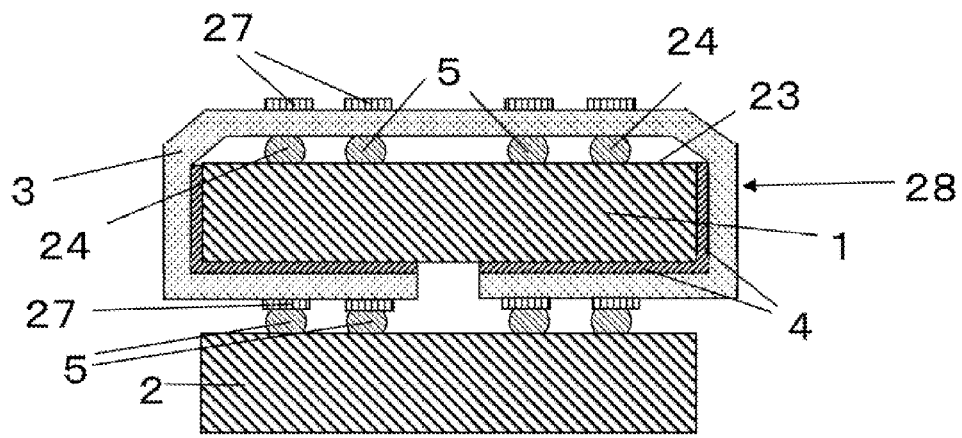
Figure 15A:
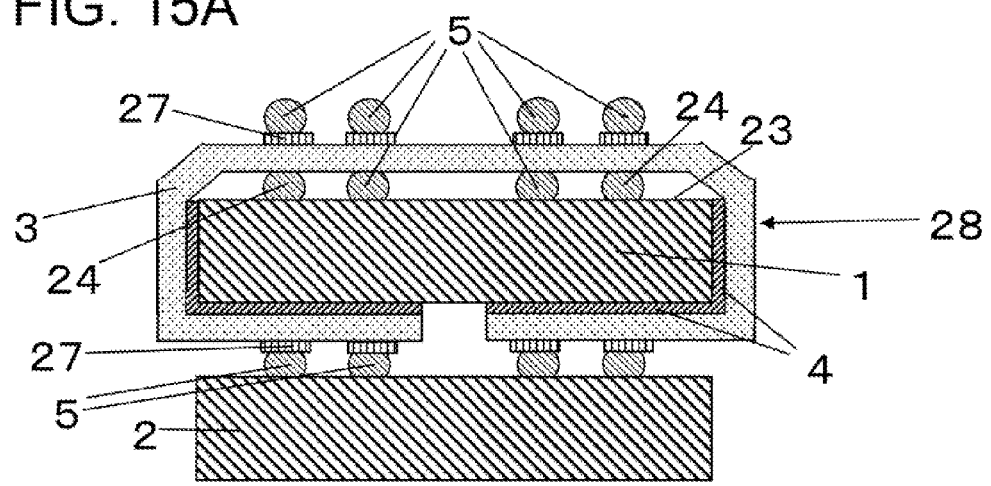
FIGS. 15A and 15B are schematic sectional views showing a fabrication method of a semiconductor device according to an exemplary embodiment 5 of the present invention.
Figure 15B:
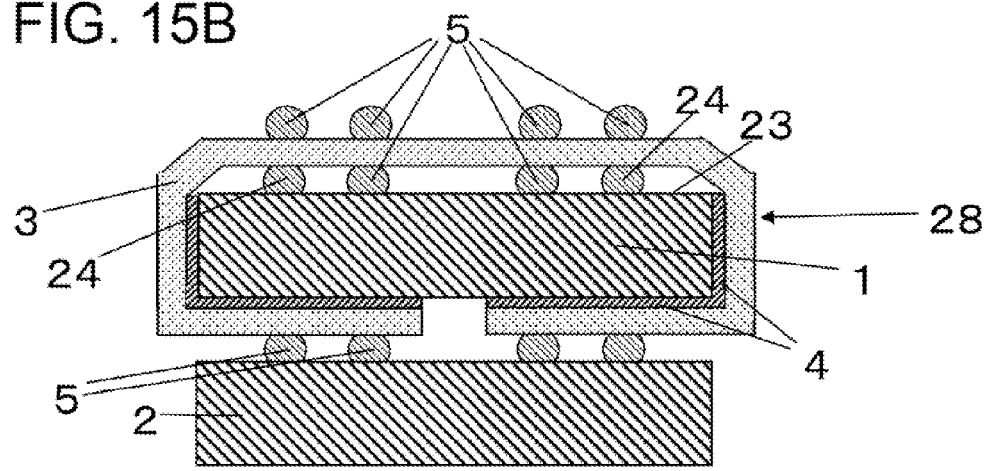

Then the positions of the solder balls 5 of the second CSP 2 and the external terminals 7 (not shown in the figure) of the semiconductor device 28 fabricated above were aligned using a camera provided on the flip-chip attach mounter and the CSP 2 was pre-fixed with a low lord about 100 g (FIG. 14A). Then flux 27 was applied on external terminals 7 (not shown) on the flexible circuit substrate 3 that are on the side of the solder balls 5 of the first CSP 1 of the semiconductor device 28, in which the flexible circuit substrate 3 and the first CSP 1 are connected, (FIG. 14B) and solder balls 5 were preliminary mounted on the external terminals 7 on which the flux are applied using a glass mask (holes corresponding to positions where solder balls are mounted are perforated) (FIG. 15A). Finally, the semiconductor device has completed (FIG. 15B) after connecting the solder balls 5 and the external terminals 7 on the flexible circuit substrate 3 in a reflow apparatus, flushing the flux 27 by ethyl methyl ketone and drying.

The external size of the semiconductor device (two DDR2-SDRAM-CSPs are stacked) according to an example 1 of the present invention was about 10.2 mm×10.6 mm×2.6 mm in height.

A measured coplanality of the solder balls (variation of the height of the solder balls) of the semiconductor device according to an example 1 has proved to be small as about 40 micrometers (a standard value of a general mounting is 100 micrometers or less). The semiconductor device of an example 1 was mounted on a circuit substrate and confirmed that no disconnection was found and that electrical performance had no problem.

Example 2

Figure 27A:
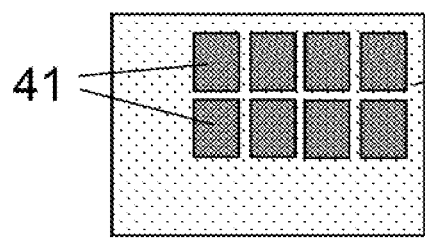
FIGS. 27A to 27C are plan views of circuit substrate according to an example 2 of the present invention.
Figure 27B:
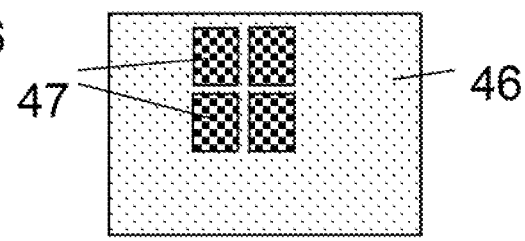
Figure 27C:
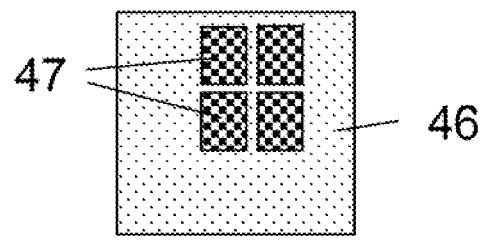
Figure 28:
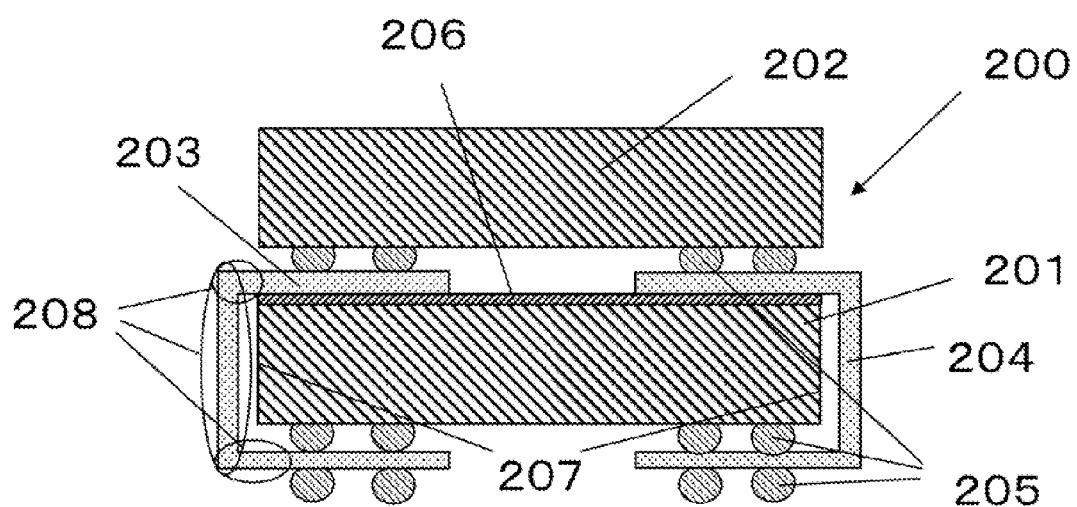
FIG. 28 shows a sectional view of a conventional art semiconductor device.

FIG. 27C shows an example 2 of the present invention. FIG. 27A is a circuit substrate 46 on which eight DDR2-SDRAM-CSPs 41 are mounted (parts are omitted except CSPs 41 for simplification) according to an example 1 of the present invention. A mounting area for eight CSPs is 1067.2 mm² including gaps between the CSPs (2 mm).

On the other hand, FIG. 27B shows a circuit substrate 46 on which four semiconductor devices 47 (two DDR2-SDRAM-CSPs are stacked in each of them) are mounted (parts are omitted except four semiconductor devices of an example 1 for simplification). A mounting area of the four semiconductor devices of an example 1 is 519.68 mm² (smaller by 547.52 mm²) and the mounting area of the DDR2-SDRAM-CSPs in the circuit substrate 46 was reduced to a half or less compared to FIG. 27A.

As a result the size of the circuit substrate 46 (parts are omitted except four semiconductor devices of an example 1 for simplification) was reduced as shown in FIG. 27C and the cost for the circuit substrate was also reduced.

The circuit substrate 46 in FIG. 27C (four semiconductor devices of an example 1 are mounted) was applied to a downsized mobile personal computer. The fabrication cost of the mobile personal computer could be reduced due to downsizing of external sizes of the computer and lower cost for the circuit substrate (not shown).

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modification aforementioned.

The invention claimed is:

1. A semiconductor device, comprising: a semiconductor package having solder balls as external terminals and a flexible circuit substrate having external terminals on both sides thereof, wherein
    the semiconductor package is connected to the external terminals of one side of the flexible circuit substrate with the solder balls;
    the flexible circuit substrate is folded so as to wrap the semiconductor package and is adhered to a side of the semiconductor package opposite to a side the external terminals being mounted; and
    the flexible circuit substrate positioned on a side facing solder balls of the semiconductor package is folded at a region inside of an edge of the semiconductor package.

2. The semiconductor device according to claim 1, wherein the flexible circuit substrate positioned on a side facing solder balls of the semiconductor package is folded at a region outside of outermost solder balls on the semiconductor package.

3. The semiconductor device according to claim 1, wherein a portion of the flexible circuit substrate from a folded position outside of the outermost solder balls to the lateral side of the semiconductor package is not in contact with the outermost solder balls.

4. The semiconductor device according to claim 1, wherein an adhesive layer is provided on at least a part of the one side of the flexible circuit substrate being connected to the semiconductor package that is in contact with the lateral side of the semiconductor package or with the opposite side to the side the external terminals being mounted.

5. The semiconductor device according to claim 1, wherein an adhesive layer is provided on at least a part of the lateral side of the semiconductor package or the opposite side thereof to the side the external terminals being mounted that is in contact with the flexible circuit substrate.

6. The semiconductor device according to claim 4, wherein the adhesive layer is made of a thermoplastic or thermosetting resin.

7. The semiconductor device according to claim 5, wherein the adhesive layer is made of a thermoplastic or thermosetting resin.

8. The semiconductor device according to claim 4, wherein the adhesive layer is made of a thermoplastic polyimide having a glass transition temperature of 70 to 140 degree C.

9. The semiconductor device according to claim 5, wherein the adhesive layer is made of a thermoplastic polyimide having a glass transition temperature of 70 to 140 degree C.

10. The semiconductor device according to claim 6, wherein a thickness of the thermoplastic resin or the thermosetting resin is not less than 20 micrometers.

11. The semiconductor device according to claim 7, wherein a thickness of the thermoplastic resin or the thermosetting resin is not less than 20 micrometers.

12. The semiconductor device according to claim 1, wherein no underfill resin is sandwiched in between the flexible circuit substrate and the semiconductor package.

* * * * *